(12) United States Patent
Kwon et al.

(10) Patent No.: US 11,824,023 B2
(45) Date of Patent: Nov. 21, 2023

(54) SEMICONDUCTOR CHIP AND SEMICONDUCTOR PACKAGE INCLUDING THE SAME

(71) Applicant: SAMSUNG ELECTRONICS CO., LTD., Suwon-si (KR)

(72) Inventors: Wonkyun Kwon, Osan-si (KR); Chulyong Jang, Anyang-si (KR)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 148 days.

(21) Appl. No.: 17/465,964

(22) Filed: Sep. 3, 2021

(65) Prior Publication Data

US 2022/0223551 A1 Jul. 14, 2022

(30) Foreign Application Priority Data

Jan. 14, 2021 (KR) ........................ 10-2021-0005390

(51) Int. Cl.
| | | |
|---|---|---|
| *H01L 23/48* | (2006.01) | |
| *H01L 25/065* | (2023.01) | |
| *H01L 23/00* | (2006.01) | |
| *H01L 21/768* | (2006.01) | |
| *H01L 25/00* | (2006.01) | |

(52) U.S. Cl.
CPC ........ *H01L 24/05* (2013.01); *H01L 21/76871* (2013.01); *H01L 23/481* (2013.01); *H01L 24/73* (2013.01); *H01L 24/83* (2013.01); *H01L 25/0657* (2013.01); *H01L 25/50* (2013.01); *H01L 2224/023* (2013.01); *H01L 2224/0401* (2013.01); *H01L 2224/05025* (2013.01)

(58) Field of Classification Search
CPC .... H01L 23/481; H01L 24/05; H01L 25/0657
See application file for complete search history.

(56) References Cited

U.S. PATENT DOCUMENTS 3,026,592 A1 9/2011 Yoon et al.
8,299,624 B2 10/2012 Matsuo
(Continued)

FOREIGN PATENT DOCUMENTS

KR 10-2010-0021856 2/2010
KR 10-1179271 8/2012
(Continued)

*Primary Examiner* — Dale E Page
*Assistant Examiner* — Wilner Jean Baptiste
(74) *Attorney, Agent, or Firm* — F. Chau & Associates, LLC

(57) ABSTRACT

A semiconductor chip includes a semiconductor substrate having a first surface and a second surface opposite to the first surface. An active layer is disposed in a portion of the semiconductor substrate adjacent to the first surface. A through electrode extends in the semiconductor substrate in a vertical direction. The through electrode has a lower surface connected to the active layer and an upper surface positioned at a level lower than a level of the second surface of the semiconductor substrate. A passivation layer is disposed on the second surface of the semiconductor substrate. A bonding pad is arranged on a portion of the passivation layer and the upper surface of the through electrode. The bonding pad has a cross-section with a "T" shape in the vertical direction. The bonding pad is connected to the through electrode.

17 Claims, 17 Drawing Sheets

(56) References Cited

U.S. PATENT DOCUMENTS

| | | |
|---|---|---|
| 8,384,225 B2 | 2/2013 | Rahman et al. |
| 8,536,672 B2 | 9/2013 | Chang et al. |
| 8,772,949 B2 | 7/2014 | Farooq et al. |
| 9,147,640 B2* | 9/2015 | Lee .................. H01L 21/76898 |
| 9,159,672 B1 | 10/2015 | Hiner et al. |
| 2007/0155165 A1 | 7/2007 | Park et al. |
| 2014/0084375 A1* | 3/2014 | Lee ...................... H01L 23/522 |
| | | 257/621 |
| 2017/0025384 A1 | 1/2017 | Park et al. |

FOREIGN PATENT DOCUMENTS

| | | |
|---|---|---|
| KR | 10-1513381 | 4/2015 |
| KR | 10-2017-0011366 | 2/2017 |

\* cited by examiner

SEMICONDUCTOR CHIP AND SEMICONDUCTOR PACKAGE INCLUDING THE SAME

CROSS-REFERENCE TO RELATED APPLICATION

This application claims priority under 35 U.S.C. § 119 to Korean Patent Application No. 10-2021-0005390, filed on Jan. 14, 2021 in the Korean Intellectual Property Office, the disclosure of which is incorporated by reference in its entirety herein.

1. TECHNICAL FIELD

The present inventive concepts relate to a semiconductor chip and a semiconductor package including the same.

2. DISCUSSION OF RELATED ART

As the storage capacity of a semiconductor package increases, the semiconductor package may include a plurality of semiconductor chips which are stacked on each other. For example, a lower semiconductor chip of the stacked plurality of semiconductor chips may have a bonding pad, and an upper semiconductor chip that is mounted on the lower semiconductor chip may have a chip connection terminal connected to the bonding pad of the lower semiconductor chip. However, the reliability of a connection structure for the stacked plurality of semiconductor chips may be insufficient and may reduce the performance of the semiconductor package.

SUMMARY

The present inventive concepts provide a semiconductor chip having increased structural reliability and a semiconductor package including the same.

According to an embodiment of the present inventive concepts, a semiconductor chip includes a semiconductor substrate having a first surface and a second surface opposite to the first surface. An active layer is disposed in a portion of the semiconductor substrate adjacent to the first surface. A through electrode extends in the semiconductor substrate in a vertical direction. The through electrode has a lower surface connected to the active layer and an upper surface positioned at a level lower than a level of the second surface of the semiconductor substrate. A passivation layer is disposed on the second surface of the semiconductor substrate. A bonding pad is arranged on a portion of the passivation layer and the upper surface of the through electrode. The bonding pad has a cross-section with a "T" shape in the vertical direction. The bonding pad is connected to the through electrode.

According to an embodiment of the present inventive concepts, a semiconductor chip includes a semiconductor substrate having a first surface and a second surface opposite to the first surface. An active layer is disposed in a portion of the semiconductor substrate that is adjacent to the first surface. A through electrode extends in the semiconductor substrate in a vertical direction. The through electrode has a lower surface connected to the active layer and an upper surface positioned at a level lower than a level of the second surface of the semiconductor substrate. A chip pad is disposed on the first surface of the semiconductor substrate and is connected to the active layer. A passivation layer is disposed on the second surface of the semiconductor substrate. A bonding pad is arranged on a portion of the passivation layer and the upper surface of the through electrode. The bonding pad has a cross-section with a "T" shape in the vertical direction. The bonding pad is connected to the through electrode. A pad seed layer is disposed on a lower portion of the bonding pad.

According to an embodiment of the present inventive concepts, a semiconductor package includes a package substrate. A lower semiconductor chip is mounted on the package substrate. The lower semiconductor chip comprises: a lower semiconductor substrate having a first surface and a second surface opposite to the first surface and having a lower active layer at a portion of the lower semiconductor substrate adjacent to the first surface thereof; a lower through electrode extending in the lower semiconductor substrate in a vertical direction, the through electrode having a lower surface connected to the lower active layer and an upper surface positioned at a level lower than a level of the second surface of the lower semiconductor substrate; a lower passivation layer disposed on the second surface of the lower semiconductor substrate; a lower bonding pad arranged on a portion of the lower passivation layer and the upper surface of the lower through electrode, the lower bonding pad having a cross-section with a "T" shape in the vertical direction, the lower bonding pad is connected to the lower through electrode; and a lower pad seed layer arranged on a lower portion of the lower bonding pad. An upper semiconductor chip is mounted on the lower semiconductor chip. The upper semiconductor chip comprises: an upper semiconductor substrate having a third surface facing the lower semiconductor chip and a fourth surface opposite to the third surface and having an upper active layer at a portion of the upper semiconductor chip adjacent to the third surface thereof; an upper chip pad disposed on the third surface of the upper semiconductor substrate and connected to the upper active layer; and an upper chip connection terminal disposed between the upper chip pad and the lower bonding pad. A molding layer surrounds the lower semiconductor chip and the upper semiconductor chip on the package substrate.

According to an embodiment of the present inventive concepts, a semiconductor chip includes a semiconductor substrate having a first surface and a second surface opposite to the first surface. An active layer is disposed in a portion of the semiconductor substrate that is adjacent to the first surface. A through electrode extends in the semiconductor substrate in a vertical direction. The through electrode has a lower surface connected to the active layer and an upper surface positioned at a level lower than a level of the second surface of the semiconductor substrate. A substrate groove is positioned on an upper surface of the through electrode. A passivation layer is disposed on the second surface of the semiconductor substrate. A bonding pad is arranged on the substrate groove. The bonding pad includes a first pad portion surrounded by inner surfaces of the semiconductor substrate and the passivation layer and a second pad portion disposed on an upper surface of the first pad portion and an upper surface of the passivation layer adjacent to the substrate groove.

A semiconductor chip according to an embodiment of the present inventive concepts may include a bonding pad having a "T" shaped cross-section in a vertical direction, and a pad seed layer conformally formed along a lower surface of the bonding pad.

Due to the above-described structure of the bonding pad of the semiconductor chip, the area of a contact region of the bonding pad and the pad seed layer may be increased.

Accordingly, in an operation of mounting a separate semiconductor chip on the semiconductor chip, a peeling phenomenon between the bonding pad and the pad seed layer may be reduced. In other words, the structural reliability of the semiconductor chip and the semiconductor package including the same may be increased.

BRIEF DESCRIPTION OF THE DRAWINGS

Embodiments of the present inventive concepts will be more clearly understood from the following detailed description taken in conjunction with the accompanying drawings in which.

DETAILED DESCRIPTION OF EMBODIMENTS

Hereinafter, embodiments of the present inventive concepts will be described in detail with reference to the accompanying drawings.

Figure 1:
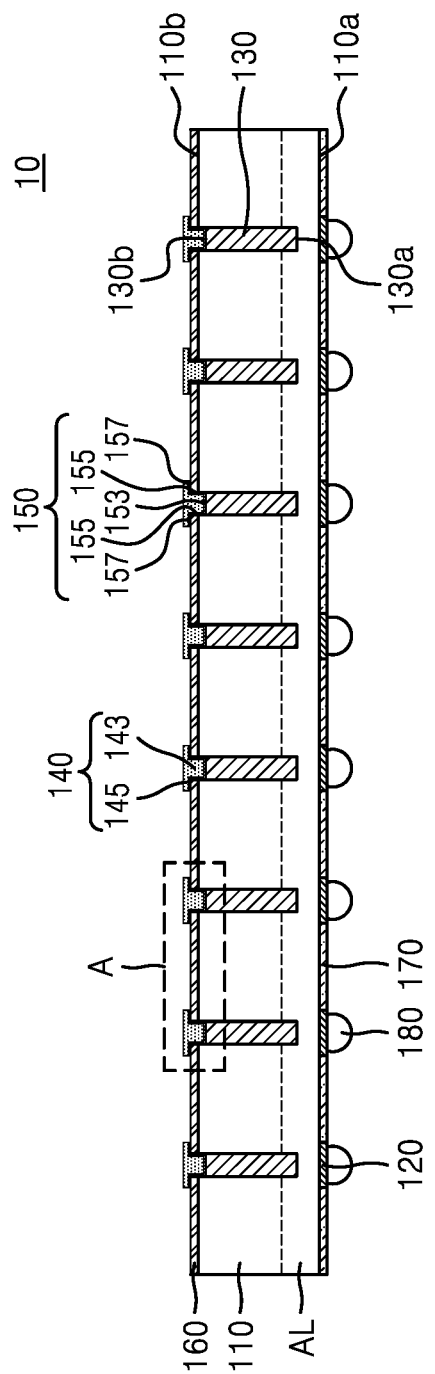
FIG. 1 is a cross-sectional view of a semiconductor chip according to an embodiment of the present inventive concepts.
Figure 2:
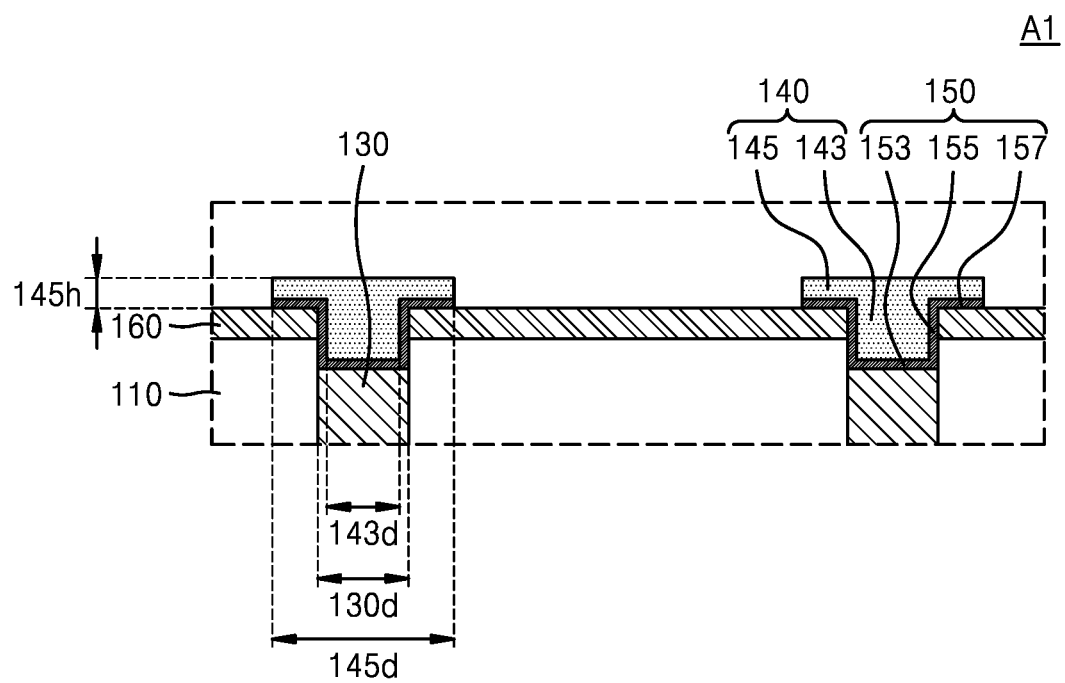
FIGS. 2 and 3 are enlarged cross-sectional views of a region A in FIG. 1 according to embodiments of the present inventive concepts.
Figure 3:
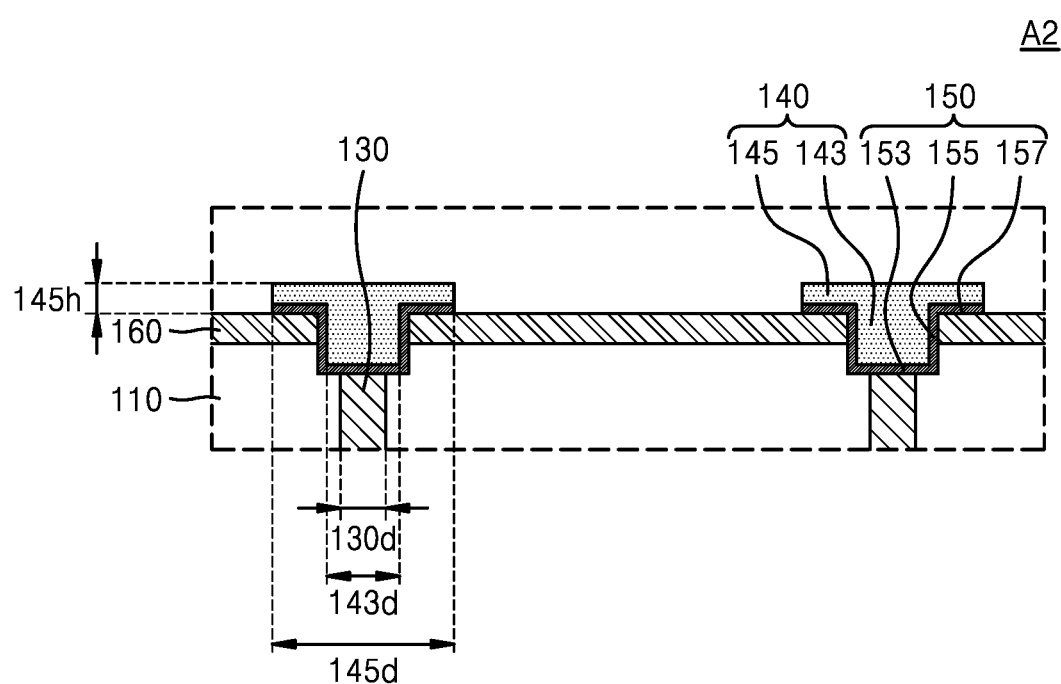

FIG. 1 is a cross-sectional view of a semiconductor chip 10 according to an embodiment of the present inventive concepts. FIGS. 2 and 3 are enlarged views of a region A in FIG. 1.

Referring to FIGS. 1 to 3, the semiconductor chip 10 according to an embodiment may include a semiconductor substrate 110, a chip pad 120, a through electrode 130, a bonding pad 140, a pad seed layer 150, a first passivation layer 160, a second passivation layer 170, a chip connection terminal 180, or the like.

In an embodiment of a semiconductor package that includes a lower semiconductor chip (30 of FIG. 5) and an upper semiconductor chip (40 of FIG. 5) mounted on the lower semiconductor chip 30, the semiconductor chip 10 according to an embodiment of the present inventive concepts may function as the lower semiconductor chip 30.

In an embodiment, the semiconductor chip 10 may include a logic semiconductor chip. The logic semiconductor chip may include, for example, a logic semiconductor chip, such as a central processor unit (CPU), a micro processor unit (MPU), a graphics processor unit (GPU), or an application processor (AP).

Also, the semiconductor chip 10 may include a memory semiconductor chip. The memory semiconductor chip may include, for example, a volatile memory semiconductor chip, such as dynamic random access memory (DRAM) or static random access memory (SRAM), and may also include a non-volatile memory chip, such as phase-change random access memory (PRAM), magneto-resistive random access memory (MRAM), ferroelectric random access memory (FeRAM), or resistive random access memory (RRAM). However, embodiments of the present inventive concepts are not limited thereto.

The semiconductor substrate 110 of the semiconductor chip 10 may have a first surface 110a and a second surface 110b opposite to the first surface 110a. For example, as shown in the embodiment of FIG. 1, the first surface 110a of the semiconductor substrate 110 may be a lower surface of the semiconductor substrate 110 on which the chip pad 120 is mounted, and the second surface 110b of the semiconductor substrate 110 may be an upper surface of the semiconductor substrate 110 on which the bonding pad 140 is mounted.

The semiconductor substrate 110 may include an active layer AL in a portion of the semiconductor substrate 110 adjacent to the first surface 110a thereof. In an embodiment, the active layer AL may include a plurality of individual devices of various types. For example, the plurality of individual devices may include various microelectronic devices, for example, complementary metal-oxide semiconductor (CMOS) transistors, metal-oxide-semiconductor filed effect transistors (MOSFETs), system large-scale integration (LSI), image sensors such as CMOS imaging sensors (CISs), micro-electro-mechanical systems (MEMSs), active elements, passive elements, or the like. However, embodiments of the present inventive concepts are not limited thereto.

In an embodiment, the semiconductor substrate 110 may include silicon (Si). Also, the semiconductor substrate 110 may include a semiconductor material, such as germanium (Ge), or a compound semiconductor, such as silicon carbide (SiC), gallium arsenide (GaAs), indium arsenide (InAs), and indium phosphide (InP). However, embodiments of the present inventive concepts are not limited thereto and the material(s) of the semiconductor substrate 110 may vary.

The chip pad 120 of the semiconductor chip 10 may be a pad arranged on the first surface 110a of the semiconductor substrate 110 and electrically connected to the plurality of individual devices in the active layer AL. For example, in an embodiment, a plurality of chip pads 120 may be provided.

In an embodiment, the material of the chip pad 120 may include aluminum (Al). However, embodiments of the present inventive concepts are not limited thereto. For example, the material of the chip pad 120 may include metals, such as nickel (Ni), copper (Cu), gold (Au), silver (Ag), tungsten (W), titanium (Ti), tantalum (Ta), indium (In), molybdenum (Mo), manganese (Mn), cobalt (Co), tin (Sn), magnesium (Mg), rhenium (Re), beryllium (Be), gallium (Ga), ruthenium (Ru), or the like, or a combination thereof.

The through electrode 130 of the semiconductor chip 10 may be arranged to extend in a vertical direction in the semiconductor substrate 110. The vertical direction may be defined as a direction perpendicular to a direction in which the first surface 110a and the second surface 110b of the semiconductor substrate 110 extend and may be a thickness direction of the semiconductor substrate 110. A horizontal direction may be defined as a direction parallel to the direction in which the first surface 110a and the second surface 110b of the semiconductor substrate 110 extend.

In an embodiment, the through electrode 130 may have a pillar shape. For example, the through electrode 130 may have a cylindrical shape, or may have a polygonal pillar shape such as a triangular pillar, a square pillar, or the like. In addition, the through electrode 130 may have a lower surface 130a connected to the active layer AL of the semiconductor substrate 110 and an upper surface 130b opposite to the lower surface 130a and connected to the bonding pad 140. For example, as shown in the embodiment of FIG. 1, the lower surface 130a of the through electrode 130 may be directly connected to the active layer AL of the semiconductor substrate 110.

Although the embodiment of FIG. 1 shows the through electrode 130 as being connected to the active layer AL by passing through only a portion of the semiconductor substrate 110, in some embodiments the through electrode 130 may be in direct contact with the chip pad 120 by completely passing through the semiconductor substrate 110.

In an embodiment, the level of the upper surface 130b of the through electrode 130 may be lower than the level of the second surface 110b of the semiconductor substrate 110. Hereinafter, the level of an element may be defined as a height at which the element is formed from the first surface 110a of the semiconductor substrate 110 in the vertical direction. For example, the level of the upper surface 130b of the through electrode 130 may be defined as a height at which the upper surface 130b of the through electrode 130 is formed from the first surface 110a of the semiconductor substrate 110 in the vertical direction. In addition, the level of the second surface 110b of the semiconductor substrate 110 may be defined as a height at which the second surface 110b of the semiconductor substrate 110 is formed from the first surface 110a in the vertical direction.

In an embodiment, as the level of the upper surface 130b of the through electrode 130 may be lower than the level of the second surface 110b of the semiconductor substrate 110, a substrate groove (110H of FIG. 15) defined by inner surfaces of the semiconductor substrate 110 and the upper surface 130b of the through electrode 130 may be provided on an upper portion of the through electrode 130. The substrate groove 110H may be filled by the bonding pad 140 and the pad seed layer 150 to be described below.

In an embodiment, the through electrode 130 may include a barrier film formed on an outer surface of the through electrode 130 and a buried conductive material layer filling the inside of the barrier film.

The first passivation layer 160 of the semiconductor chip 10 may be a layer of an insulating material arranged on the second surface 110b of the semiconductor substrate 110. For example, the first passivation layer 160 may be arranged on the second surface 110b of the semiconductor substrate 110 and surround a portion of the pad seed layer 150. In addition, the first passivation layer 160 may not cover the upper surface 130b of the through electrode 130.

In an embodiment, the material of the first passivation layer 160 may include silicon nitride (SiN). However, embodiments of the present inventive concepts are not limited thereto. For example, in an embodiment, the material of the first passivation layer 160 may include one of silicon oxynitride (SiON), silicon oxide ($SiO_2$), silicon carbonate nitride (SiOCN), silicon carbonitride (SiCN), and a combination thereof.

The bonding pad 140 of the semiconductor chip 10 may be a pad disposed on a portion of the first passivation layer 160 and the through electrode 130 and electrically connected to the through electrode 130. In addition, in an embodiment, the bonding pad 140 may be a pad which is in direct contact with a chip connection terminal (e.g., an upper chip connection terminal 440 of FIG. 5) included in a separate semiconductor chip (40 of FIG. 5) mounted on the semiconductor chip 10.

As shown in the embodiment of FIG. 1, a vertical cross-section of the bonding pad 140 may have an alphabetical letter "T" shape. In addition, a horizontal cross-section of the bonding pad 140 may have a circular shape.

In an embodiment, the bonding pad 140 may include a first pad portion 143 and a second pad portion 145. The first pad portion 143 may be a portion of the bonding pad 140 that is surrounded by the semiconductor substrate 110 and the first passivation layer 160. In addition, the first pad portion 143 may be a portion of the bonding pad 140 that is in direct contact with a first seed portion 153 and a second seed portion 155 of the pad seed layer 150 to be described below.

In an embodiment, the second pad portion 145 may be a portion of the bonding pad 140 that is disposed on a portion of the first passivation layer 160 and the first pad portion 143. For example, a portion of the second pad portion 145 (e.g., a central portion in the horizontal direction) may be disposed directly on the first pad portion 143 in the vertical direction and ends of the second pad portion 145 may be disposed on the first passivation layer 160 in the vertical direction with a third seed portion 157 disposed therebetween. The second pad portion 145 has a length 145d in a horizontal direction that is greater than a length 143d of the first pad portion 143 in the horizontal direction. For example, ends of the second pad portion 145 (e.g., lateral ends) may not overlap the first pad portion 143 in the vertical direction. In addition, the ends of the second pad portion 145 may be a portion of the bonding pad 140 that is supported by the third seed portion 157 of the pad seed layer 150 to be described below.

In an embodiment, the first pad portion 143 of the bonding pad 140 may be integrated with the second pad portion 145 of the bonding pad 140. In addition, the first pad portion 143 of the bonding pad 140 may include substantially the same material as the material of the second pad portion 145 of the bonding pad 140.

In an embodiment, a cross-section of the first pad portion 143 of the bonding pad 140 in the vertical direction may have a rectangular shape. However, embodiments of the present inventive concepts are not limited thereto. For example, in some embodiments, at least a portion of the lateral sides of the first pad portion 143 may not be aligned and the length of the first pad portion 143 in the horizontal direction may vary. In addition, the cross-section of the second pad portion 145 of the bonding pad 140 in the vertical direction may have a rectangular shape having the length 145d in the horizontal direction that is greater than the length 143d of the first pad portion 143 in the horizontal direction. However, embodiments of the present inventive concepts are not limited thereto. For example, in some embodiments, at least a portion of the lateral sides of the second pad portion 145 may not be aligned and the length of the second pad portion 145 in the horizontal direction may vary.

In an embodiment, the length 143d of the first pad portion 143 of the bonding pad 140 in the horizontal direction may be in a range of about 2 micrometers to about 6 micrometers. For example, in an embodiment, the length 143d of the first pad portion 143 in the horizontal direction may be about 4 micrometers.

Referring to the embodiment of FIG. 2, a sum of the length 143*d* of the first pad portion 143 of the bonding pad 140 in the horizontal direction and the thickness of the pad seed layer 150 (e.g., length in the horizontal direction) may be substantially the same as a length 130*d* of the through electrode 130 in the horizontal direction.

However, embodiments of the present inventive concepts are not limited thereto. For example, as shown in the embodiment of FIG. 3, the length 143*d* of the first pad portion 143 of the bonding pad 140 in the horizontal direction may be greater than the length 130*d* of the through electrode 130 in the horizontal direction.

As the length 143*d* of the first pad portion 143 of the bonding pad 140 in the horizontal direction may be greater than the length 130*d* of the through electrode 130 in the horizontal direction, the bonding pad 140 may have increased structural reliability. For example, in an operation of mounting a separate semiconductor chip (40 of FIG. 5) on the semiconductor chip 10 according to an embodiment of the present inventive concepts, a peeling phenomenon between the bonding pad 140 and the pad seed layer 150 may be reduced.

In an embodiment, the length 145*d* of the second pad portion 145 of the bonding pad 140 in the horizontal direction may be in a range of about 15 micrometers to about 20 micrometers. For example, in an embodiment, the length 145*d* of the second pad portion 145 in the horizontal direction may be about 17 micrometers.

In addition, a length 145*h* of the second pad portion 145 of the bonding pad 140 in the vertical direction may be in a range of about 2 micrometers to about 3 micrometers. For example, the length 145*h* of the second pad portion 145 in the vertical direction may be about 2.5 micrometers.

In addition, as the thickness of the pad seed layer 150 may be much less than the length 145*h* of the second pad portion 145 in the vertical direction, the length 145*h* of the second pad portion 145 in the vertical direction may be defined as a total length that includes the thickness of the pad seed layer 150.

In an embodiment, a material of the bonding pad 140 may include a metal, such as Ni, Al, Cu, Au, Ag, W, Ti, Ta, In, Mo, Mn, Co, Sn, Mg, Re, Be, Ga, Ru, or the like, or a combination thereof. However, embodiments of the present inventive concepts are not limited thereto. For example, in an embodiment, the material of the bonding pad 140 may have a structure in which Au is stacked on Ni.

The pad seed layer 150 of the semiconductor chip 10 may be a layer disposed below the bonding pad 140 and conformally formed along a portion of the first passivation layer 160, such as a portion of the upper surface of the first passivation layer 160 and an inner surface of the first passivation layer 160, the inner surface of the semiconductor substrate 110, and the upper surface 130*b* of the through electrode 130. For example, the pad seed layer 150 may be a layer conformally formed along a lower surface of the bonding pad 140.

In an embodiment, the thickness of the pad seed layer 150 may be in a range of about 200 nanometers to about 300 nanometers. For example, in an embodiment, the thickness of the pad seed layer 150 may be about 250 nanometers.

In an embodiment, the pad seed layer 150 may be formed by performing physical vapor deposition, and the bonding pad 140 may be formed by performing a plating operation using the pad seed layer 150. For example, when Cu is used as the material of the bonding pad 140, at least a portion of the pad seed layer 150 may function as a diffusion barrier layer.

In an embodiment, a material of the pad seed layer 150 may include Ti, titanium tungsten (TiW), titanium nitride (TiN), Ta, tantalum nitride (TaN), chromium (Cr), Al, or a combination thereof. For example, a structure of the pad seed layer 150 may include Cu/Ti in which copper is stacked on titanium, or Cu/TiW in which copper is stacked on titanium tungsten. However, embodiments of the present inventive concepts are not limited thereto and the material of the pad seed layer 150 may vary.

In an embodiment, the pad seed layer 150 may include the first seed portion 153, the second seed portion 155, and the third seed portion 157. The first seed portion 153 may be a portion of the pad seed layer 150 that is disposed between the upper surface 130*b* of the through electrode 130 and a lower surface of the first pad portion 143 of the bonding pad 140. For example, a lower surface of the first seed portion 153 may directly contact an upper surface 130*b* of the through electrode 130 and an upper surface of the first seed portion 153 may directly contact a lower surface of the first pad portion 143. The first seed portion 153 may be a portion of the pad seed layer 150 that overlaps the first pad portion 143 of the bonding pad 140 in the vertical direction.

In an embodiment, the second seed portion 155 may be a portion of the pad seed layer 150 that extends from the first seed portion 153 in the vertical direction and is disposed between a lateral side surface of the first pad portion 143 of the bonding pad 140 and inner surfaces of the semiconductor substrate 110 and the first passivation layer 160. For example, a lower surface of the second seed portion 155 may be disposed between the inner surfaces of the semiconductor substrate 110 and the first pad portion 143 of the bonding pad 140 in the horizontal direction. An upper surface of the second seed portion 155 may be disposed between the inner surfaces of the first passivation layer 160 and the first pad portion 143 of the bonding pad 140 in the horizontal direction. In addition, the second seed portion 155 may be surrounded by the lateral side surfaces of the first pad portion 143. In addition, the second seed portion 155 may be a portion of the pad seed layer 150 that overlaps the first pad portion 143 of the bonding pad 140 in the horizontal direction.

In an embodiment, the third seed portion 157 may extend from the second seed portion 155 in the horizontal direction and be disposed between the first passivation layer 160 and the second pad portion 145 of the bonding pad 140 in the vertical direction. In addition, the third seed portion 157 may be a portion of the pad seed layer 150 that supports an edge of the second pad portion 145. For example, a lower surface of the edges of the second pad portion 145 may directly contact upper surfaces of the third seed portion 157. In addition, the third seed portion 157 may be a portion of the pad seed layer 150 that does not overlap the first pad portion 143 of the bonding pad 140 in the vertical direction but overlaps a portion of the second pad portion 145 in the vertical direction. For example, the third seed portion 157 may overlap the ends of the second pad portion 145 in the vertical direction.

In an embodiment, the second passivation layer 170 may be a layer of an insulating material disposed on the first surface 110*a* of the semiconductor substrate 110 and surrounding a side surface of the chip pad 120. Also, the second passivation layer 170 may expose a bonding surface of the chip pad 120.

In an example embodiment, the material of the second passivation layer 170 may include SiN. However, embodiments of the present inventive concepts are not limited thereto, and the material of the second passivation layer 170 may vary. For example, the material of the second passivation layer 170 may include one of SiON, SiO2, SiOCN, SiCN, and a combination thereof.

Figure 5:
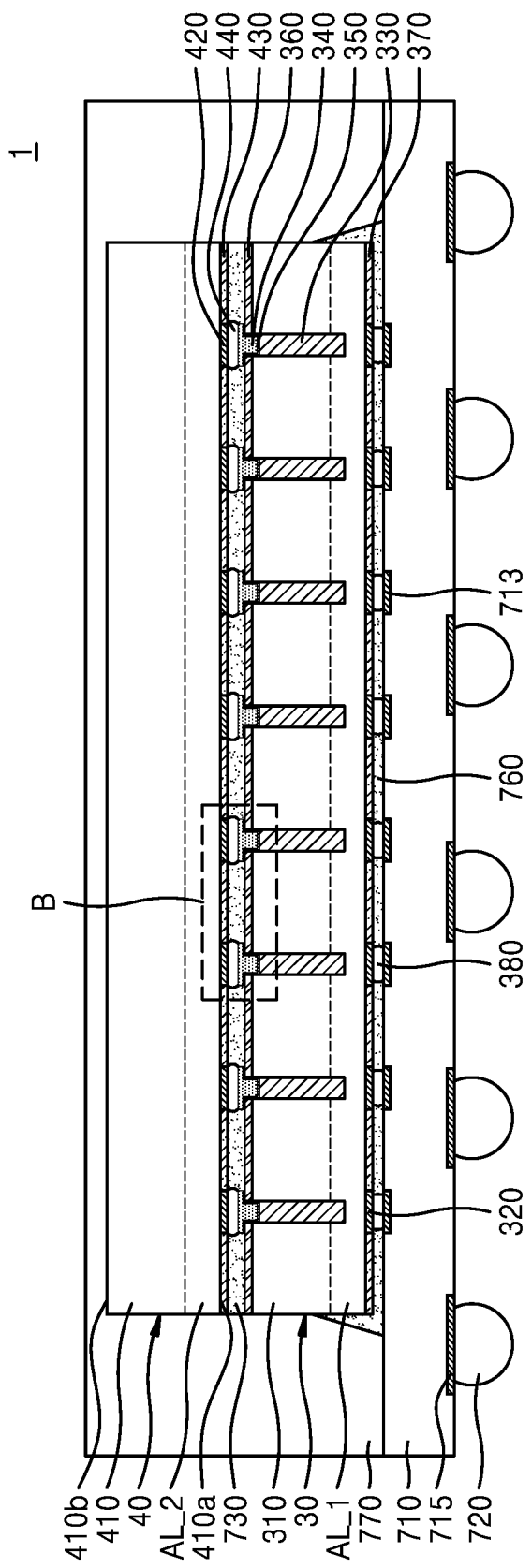
FIG. 5 is a cross-sectional view of a semiconductor package according to an embodiment of the present inventive concepts.

The chip connection terminal 180 of the semiconductor chip 10 may be a connection terminal electrically connecting the semiconductor chip 10 to a package substrate (710 of FIG. 5). However, embodiments of the present inventive concepts are not limited thereto. For example, in an embodiment, the chip connection terminal 180 may be a connection terminal for electrical connection between semiconductor chips.

In an embodiment, the chip connection terminal 180 may be attached to the bonding surface of the chip pad 120. For example, an upper surface of the chip connection terminal 180 may directly contact a lower surface of the chip pad 120. In an embodiment, the chip connection terminal 180 may be a solder ball including a metal material including at least one of Sn, Ag, Cu, and Al. However, embodiments of the present inventive concepts are not limited thereto.

In the case of a semiconductor chip according to a comparative example, a bonding pad and a pad seed layer included in the semiconductor chip may have a plate shape in which upper and lower surfaces thereof are parallel to each other, and shapes and areas of the upper and lower surfaces thereof are the same.

The semiconductor chip 10 according to an embodiment of the present inventive concepts may include the bonding pad 140 having a "T" shaped cross-section in the vertical direction, and the pad seed layer 150 conformally formed along the lower surface of the bonding pad 140. While the bonding pad 140 is described as having a "T" shaped cross-section in the vertical direction, the bonding pad 140 may have any similar shape in which the bonding pad 140 is arranged on the substrate groove 110H and has a first pad portion 143 surrounded by inner surfaces of the semiconductor substrate 110 and the first passivation layer 160 and a second pad portion 145 disposed directly on an upper surface of the first pad portion 143 and an upper surface of the first passivation layer 160 adjacent to the substrate groove 110H.

An area of a contact region between the bonding pad 140 and the pad seed layer 150 of the semiconductor chip 10 according to an embodiment of the present inventive concepts may be greater than an area of a contact region between the bonding pad and the pad seed layer of the semiconductor chip according to the comparative example.

Accordingly, the bonding pad 140 of the semiconductor chip 10 according to an embodiment of the present inventive concepts may have an increased structural reliability. For example, in the operation of mounting a separate semiconductor chip (40 of FIG. 5) on the semiconductor chip 10, a peeling phenomenon between the bonding pad 140 and the pad seed layer 150 may be reduced.

Figure 4:
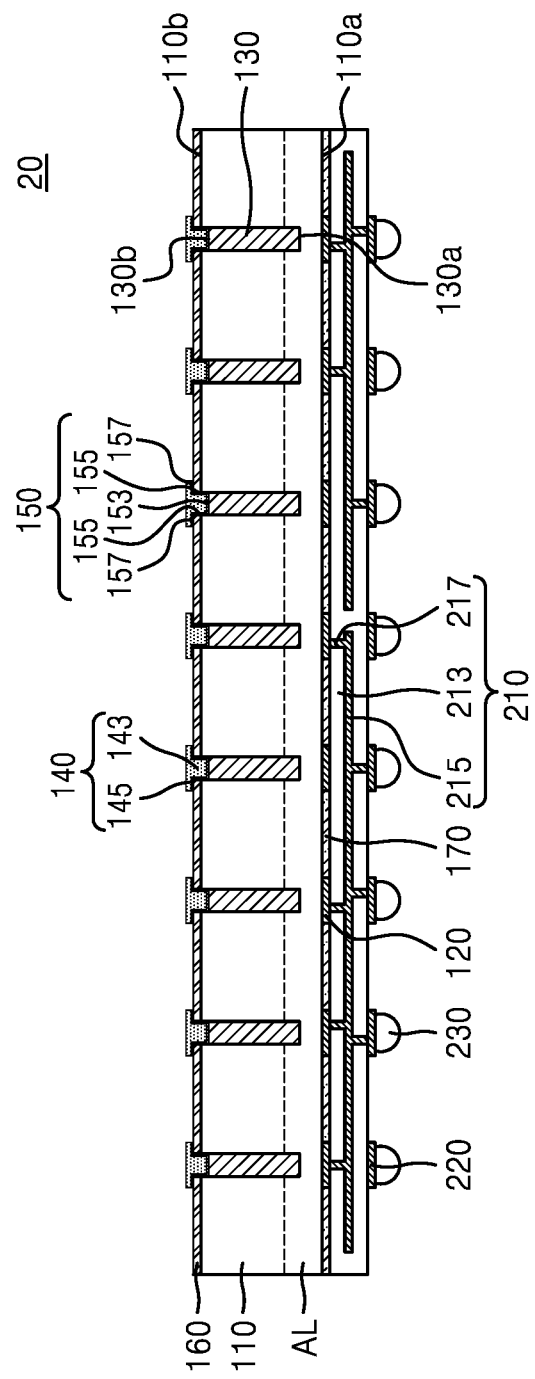
FIG. 4 is a cross-sectional view of a semiconductor chip according to an embodiment of the present inventive concepts.

FIG. 4 is a cross-sectional view of a semiconductor chip 20 according to an embodiment of the present inventive concepts.

Referring to FIG. 4, the semiconductor chip 20 according to an embodiment of the present inventive concepts may include the semiconductor substrate 110, the chip pad 120, the through electrode 130, the bonding pad 140, the pad seed layer 150, the first passivation layer 160, the second passivation layer 170, a redistribution structure 210, an under bump metal (UBM) 220, and a chip connection terminal 230.

Hereinafter, differences between the semiconductor chip 10 of FIG. 1 and the semiconductor chip 20 of FIG. 4 will be mainly described, and redundant descriptions thereof will be omitted for convenience of explanation.

The redistribution structure 210 of the semiconductor chip 20 may be a structure arranged on the first surface 110a of the semiconductor substrate 110. In an embodiment, the redistribution structure 210 may include a redistribution insulating layer 213, a redistribution line pattern 215 arranged in the redistribution insulating layer 213 to extend in a horizontal direction, and a redistribution via pattern 217 arranged in the redistribution insulating layer 213 to extend in a vertical direction.

The redistribution insulating layer 213 may be an insulating material layer surrounding the redistribution line pattern 215 and the redistribution via pattern 217. In an embodiment, the redistribution insulating layer 213 may include an oxide or a nitride. For example, the redistribution insulating layer 213 may include silicon oxide or silicon nitride.

In an embodiment, the redistribution insulating layer 213 may include an insulating material of a photoimageable dielectric (PID) material. For example, the redistribution insulating layer 213 may include photosensitive polyimide (PSPI).

However, embodiments of the present inventive concepts are not limited thereto. For example, unlike the embodiment shown in FIG. 4, the redistribution line pattern 215 may have a plurality of layers in the redistribution insulating layer 213, and the plurality of layers of the redistribution line pattern 215 may be electrically connected to each other through the redistribution via pattern 217.

In an embodiment, a first portion of the redistribution via pattern 217 may electrically connect the chip pad 120 to the redistribution line pattern 215. In addition, a second portion of the redistribution via pattern 217 may electrically connect the redistribution line pattern 215 to the UBM 220.

In addition, a material of each of the redistribution line pattern 215 and the redistribution via pattern 217 may include Cu. However, embodiments of the present inventive concepts are not limited thereto, and the material of each of the redistribution line pattern 215 and the redistribution via pattern 217 may include a metal, such as Ni, Au, Ag, Al, W, Ti, Ta, In, Mo, Mn, Co, Sn, Mg, Re, Be, Ga, Ru, or the like, or a combination thereof.

The UBM 220 of the semiconductor chip 20 may be a pad attached to one surface of the redistribution structure 210 and connected to the redistribution via pattern 217. One surface of the UBM 220 may be in contact with the redistribution via pattern 217, and the other surface thereof may be in contact with the chip connection terminal 230. For example, as shown in the embodiment of FIG. 4, an upper surface of the UBM 220 may directly contact the redistribution via pattern 217 and a lower surface of the UBM 220 may directly contact the chip connection terminal 230.

In an embodiment, the UBM 220 may include a metal, such as Cu, Al, W, Ti, Ta, In, Mo, Mn, Co, Sn, Ni, Mg, Re, Be, Ga, Ru, or the like, or a combination thereof. However, embodiments of the present inventive concepts are not limited thereto and the material of the UBM 200 may vary.

The chip connection terminal 230 of the semiconductor chip 20 may be attached to the UBM 220 and electrically connected to the active layer AL of the semiconductor substrate 110 through the redistribution line pattern 215 and the redistribution via pattern 217.

In an embodiment, the chip connection terminal 230 may be a solder ball including a metal material including at least one of Sn, Ag, Cu, and Al. However, embodiments of the present inventive concepts are not limited thereto.

Figure 6:
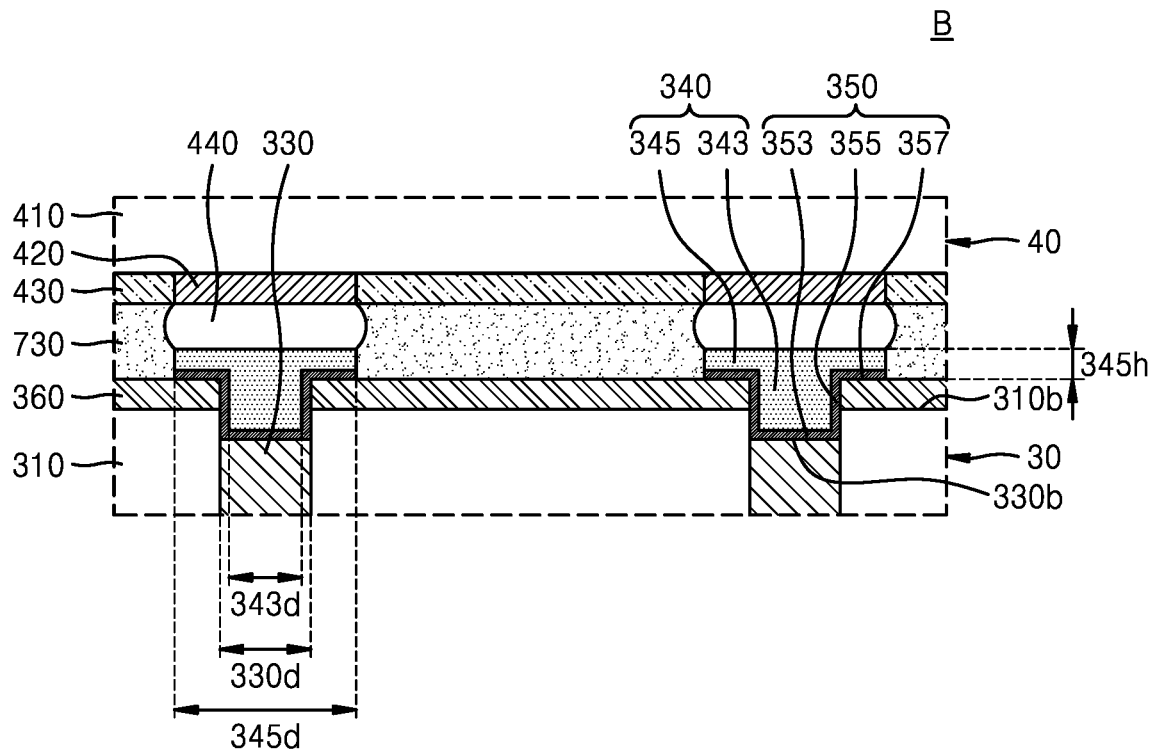
FIG. 6 is an enlarged cross-sectional view of a region indicated by "B" in FIG. 5 according to an embodiment of the present inventive concepts.

FIG. 5 is a cross-sectional view of a semiconductor package 1 according to an embodiment of the present inventive concepts. FIG. 6 is an enlarged view of a region B in FIG. 5.

Referring to FIGS. 5 and 6 together, the semiconductor package 1 according to an embodiment of the present inventive concepts may be a semiconductor package including a plurality of semiconductor chips (e.g., a lower semiconductor chip 30 and an upper semiconductor chip 40). For example, the semiconductor package 1 may be a semiconductor package including the lower semiconductor chip 30 and the upper semiconductor chip 40 mounted on the lower semiconductor chip 30.

The semiconductor package 1 according to an embodiment of the present inventive concepts may include the lower semiconductor chip 30, the upper semiconductor chip 40, a package substrate 710, a package connection terminal 720, an adhesive layer 730, an underfill member 760, a molding layer 770, or the like.

In an embodiment, the lower semiconductor chip 30 and the upper semiconductor chip 40 included in the semiconductor package 1 may be semiconductor chips of different types. For example, the semiconductor package 1 may be a system-in-package (SIP) in which the lower and upper semiconductor chips 30 and 40 of different types from each other are electrically connected to each other and operate as a single system.

For example, in an embodiment, the lower semiconductor chip 30 is a memory semiconductor chip and the upper semiconductor chip 40 is a logic semiconductor chip. In addition, in an embodiment, the lower semiconductor chip 30 is a logic semiconductor chip and the upper semiconductor chip 40 is a memory semiconductor chip.

The lower semiconductor chip 30 may be a semiconductor chip mounted on the package substrate 710. The lower semiconductor chip 30 may include a lower semiconductor substrate 310 having a lower active layer AL_1, a lower chip pad 320, a lower through electrode 330, a lower bonding pad 340, a lower pad seed layer 350, a first lower passivation layer 360, a second lower passivation layer 370, a lower chip connection terminal 380, or the like.

Since the description of the lower semiconductor chip 30 is similar or identical to the description of the semiconductor chip 10 given above with reference to FIGS. 1 and 2, detailed description thereof will be omitted for convenience of explanation. The lower semiconductor chip 30 may be connected to the package substrate 710 through the lower chip connection terminal 380.

As shown in the embodiment of FIG. 6, the lower bonding pad 340 of the lower semiconductor chip 30 may include a first lower pad portion 343 and a second lower pad portion 345. The first lower pad portion 343 may be a portion of the lower bonding pad 340 that is surrounded by the lower semiconductor substrate 310 and the first lower passivation layer 360.

In an embodiment, the second lower pad portion 345 may be a portion of the lower bonding pad 340 that is disposed on a portion of the first lower passivation layer 360 and the first lower pad portion 343. The second lower pad portion 345 may have a length 345d in a horizontal direction that is greater a length 343d of the first lower pad portion 343 in the horizontal direction.

In an embodiment, the length 343d of the first lower pad portion 343 of the lower bonding pad 340 in the horizontal direction may be in a range of about 2 micrometers to about 6 micrometers. For example, the length 343d of the first lower pad portion 343 in the horizontal direction may be about 4 micrometers.

In an embodiment, the length 345d of the second lower pad portion 345 of the lower bonding pad 340 in the horizontal direction may be in a range of about 15 micrometers to about 20 micrometers. For example, the length 345d of the second lower pad portion 345 in the horizontal direction may be about 17 micrometers.

In an embodiment, a sum of the length 343d of the first lower pad portion 343 of the lower bonding pad 340 and the thickness of the lower pad seed layer 350 (e.g., length in the horizontal direction) may be substantially the same as a length 330d of the lower through electrode 330 in the horizontal direction.

However, embodiments of the present inventive concepts are not limited thereto. For example, in an embodiment, the length 343d of the first lower pad portion 343 of the lower bonding pad 340 in the horizontal direction may be greater than the length 330d of the lower through electrode 330 in the horizontal direction. As the length 343d of the first lower pad portion 343 of the lower bonding pad 340 in the horizontal direction may be greater than the length 330d of the lower through electrode 330 in the horizontal direction, the lower bonding pad 340 may have increased structural reliability.

In addition, a length 345h of the second lower pad portion 345 of the lower bonding pad 340 in the vertical direction may be in a range of about 2 micrometers to about 3 micrometers. For example, the length 345h of the second lower pad portion 345 in the vertical direction may be about 2.5 micrometers.

In an embodiment, the lower pad seed layer 350 of the lower semiconductor chip 30 may include a first lower seed portion 353, a second lower seed portion 355, and a third lower seed portion 357. The first lower seed portion 353 may be a portion of the lower pad seed layer 350 disposed between an upper surface of the lower through electrode 330 and a lower surface of the first lower pad portion 343 of the lower bonding pad 340 in the vertical direction. In addition, the first lower seed portion 353 may be a portion of the lower pad seed layer 350 that overlaps the first lower pad portion 343 of the lower bonding pad 340 in the vertical direction.

In an embodiment, the second lower seed portion 355 may be a portion of the lower pad seed layer 350 disposed between a side surface of the first lower pad portion 343 of the lower bonding pad 340 and inner surfaces of the lower semiconductor substrate 310 and the first lower passivation layer 360 in the horizontal direction and surrounding the lateral side surface of the first lower pad portion 343. In addition, the second lower seed portion 355 may be a portion of the lower pad seed layer 350 that overlaps the first lower pad portion 343 of the lower bonding pad 340 in the horizontal direction.

In an embodiment, the third lower seed portion 357 may be a portion of a lower pad seed layer 350 disposed between the first lower passivation layer 360 and the second lower pad portion 345 of the lower bonding pad 340 in a vertical direction and supporting an edge of the second lower pad portion 345. In addition, the third lower seed portion 357 may be a portion of the lower pad seed layer 350 that does not overlap the first lower pad portion 343 of the lower bonding pad 340 in the vertical direction and overlaps the second lower pad portion 345 in the vertical direction.

The upper semiconductor chip 40 may be a semiconductor chip mounted on the lower semiconductor chip 30 and electrically connected to the lower semiconductor chip 30.

The upper semiconductor chip 40 may include an upper semiconductor substrate 410 having an upper active layer AL_2, an upper chip pad 420, an upper passivation layer 430, an upper chip connection terminal 440, or the like. Hereinafter, differences between the lower semiconductor chip 30 and the upper semiconductor chip 40 will be mainly described, and redundant descriptions thereof will be omitted for convenience of explanation.

The upper semiconductor substrate 410 of the upper semiconductor chip 40 may have a third surface 410a facing the lower semiconductor chip 30, and a fourth surface 410b opposite to the third surface 410a. For example, as shown in the embodiment of FIG. 5, the third surface 410a may be a lower surface of the upper semiconductor substrate 410 and the fourth surface 410b may be an upper surface of the upper semiconductor substrate 410. In addition, the upper semiconductor chip 40 may have the upper active layer AL_2 in a portion thereof adjacent (e.g., in the vertical direction) to the third surface 410a thereof.

The upper chip pad 420 of the upper semiconductor chip 40 may be a pad arranged on the third surface 410a of the upper semiconductor substrate 410 and connected to the upper active layer AL_2.

The upper passivation layer 430 of the upper semiconductor chip 40 may be a layer of an insulating material arranged on the third surface 410a of the upper semiconductor substrate 410 and surrounding side portions of the upper chip pad 420.

The upper chip connection terminal 440 of the upper semiconductor chip 40 may be a connection terminal connecting the lower semiconductor chip 30 to the upper semiconductor chip 40. For example, the upper chip connection terminal 440 may be disposed between the lower bonding pad 340 of the lower semiconductor chip 30 and the upper chip pad 420 of the upper semiconductor chip 40 in the vertical direction and may electrically connect the lower semiconductor chip 30 to the upper semiconductor chip 40.

The package substrate 710 may be a substrate on which a plurality of semiconductor chips (e.g., the lower semiconductor chip 30 and the upper semiconductor chips 40) are mounted and connecting the plurality of semiconductor chips (e.g., the lower semiconductor chip 30 and the upper semiconductor chips 40) to external devices. In an embodiment, the package substrate 710 may be a double-sided printed circuit board (PCB) including a first package substrate pad 713 and a second package substrate pad 715. However, embodiments of the present inventive concepts are not limited to thereto. For example, in an embodiment, the package substrate 710 may be a single-sided PCB including the first package substrate pad 713 disposed on only one surface thereof.

In an embodiment, the package substrate 710 is not limited to the structure and the material of a PCB, and may include various types of substrates, such as a ceramic substrate, etc.

The package connection terminal 720 may be a terminal attached to the second package substrate pad 715 of the package substrate 710 and connecting the semiconductor package 1 to an external device. For example, in an embodiment, the package connection terminal 720 may be a solder ball including a metal material including at least one of Sn, Ag, Cu, and Al. However, embodiments of the present inventive concepts are not limited thereto.

The adhesive layer 730 may be a layer arranged between the lower semiconductor chip 30 and the upper semiconductor chip 40 and surrounding the lower bonding pad 340 of the lower semiconductor chip 30 and the upper chip connection terminal 440 of the upper semiconductor chip 40.

In addition, the adhesive layer 730 may include an adhesive material for fixing the upper semiconductor chip 40 on the lower semiconductor chip 30. For example, in an embodiment, the adhesive layer 730 may be a die attach film (DAF). However, embodiments of the present inventive concepts are not limited thereto and the type of the adhesive layer 730 may vary.

In an embodiment, lateral side surfaces of the adhesive layer 730 may be on the same plane as (e.g., aligned with along the vertical direction) at least one of a lateral side surface of the lower semiconductor chip 30 and a lateral side surface of the upper semiconductor chip 40. For example, as shown in FIG. 5, the side surfaces of the adhesive layer 730 may be on the same plane as the side surface of the lower semiconductor chip 30 and the side surface of the upper semiconductor chip 40.

The underfill member 760 may be a layer that fills a space between the lower semiconductor chip 30 and the package substrate 710 and surrounds the lower chip connection terminal 380 of the lower semiconductor chip 30 in the horizontal direction. The underfill member 760 may be a layer configured to fix the lower semiconductor chip 30 on the package substrate 710.

In an embodiment, the underfill member 760 may include at least one material selected from an insulating polymer and an epoxy resin. For example, the underfill member 760 may include an epoxy molding compound (EMC).

The molding layer 770 may be a layer surrounding the plurality semiconductor chips (e.g., the lower semiconductor chip 30 and the upper semiconductor chips 40) on the package substrate 710. In addition, the molding layer 770 may be a layer fixing the plurality of semiconductor chips (e.g., the lower semiconductor chip 30 and the upper semiconductor chips 40) on the package substrate 710.

In an embodiment, the molding layer 770 may form the exterior of the semiconductor package 1 together with the package substrate 710. For example, lateral side surfaces of the molding layer 770 and lateral side surfaces of the package substrate 710 may form lateral side surfaces of the semiconductor package 1. Also, an upper surface of the molding layer 770 may form an upper surface of the semiconductor package 1, and a lower surface of the package substrate 710 may form a lower surface of the semiconductor package 1. In addition, the lateral side surfaces of the molding layer 770 may be on the same plane as the lateral side surfaces of the package substrate 710. For example, the lateral side surfaces of the molding layer 770 and the package substrate 710 may be aligned along the vertical direction.

In an embodiment, the molding layer 770 may surround the fourth surface 410b of the upper semiconductor substrate 410 of the upper semiconductor chip 40. However, embodiments of the present inventive concepts are not limited thereto. For example, in some embodiments, a surface of the molding layer 770 may be also on the same plane as the fourth surface 410b of the upper semiconductor substrate 410 (e.g., aligned in the vertical direction). When the fourth surface 410b of the upper semiconductor substrate 410 is exposed to the outside by the molding layer 770, the semiconductor package 1 may become thinner and lighter, and the heat radiation performance of the semiconductor package 1 may be increased.

In an embodiment, the molding layer 770 may include EMC as a material. However, embodiments of the present inventive concepts are not limited thereto and the material of the molding layer 770 may vary. For example, the material of the molding layer 770 may include various materials, for example, an epoxy-based material, a thermosetting material, a thermoplastic material, a UV-treated material, or the like.

Figure 7:
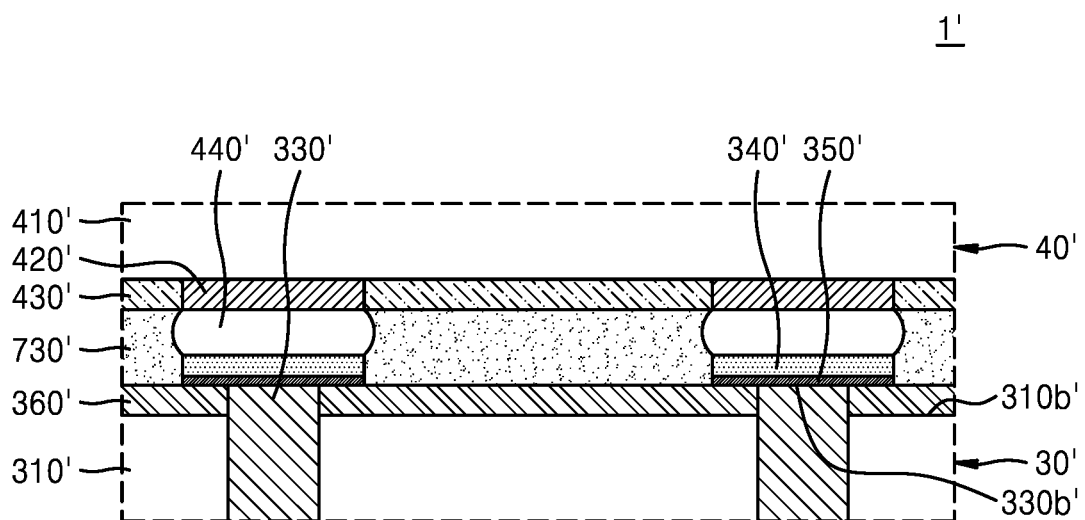
FIG. 7 is an enlarged cross-sectional view of a portion of a semiconductor package according to a comparative example.

FIG. 7 is an enlarged view of a portion of a semiconductor package according to a comparative example.

Hereinafter, descriptions will be made by comparing the semiconductor package 1 according to an embodiment of the present inventive concept to a semiconductor package 1' according to a comparative example with reference to FIGS. 6 and 7 together.

Referring to FIG. 7, the semiconductor package 1' according to a comparative example may include a lower semiconductor chip 30', an upper semiconductor chip 40' mounted on the lower semiconductor chip 30', and an adhesive layer 730' between the lower semiconductor chip 30' and the upper semiconductor chip 40'.

The lower semiconductor chip 30' may include a lower semiconductor substrate 310', a lower passivation layer 360', a lower through electrode 330', a lower bonding pad 340', and a lower pad seed layer 350'.

Also, the upper semiconductor chip 40' may include an upper semiconductor substrate 410', an upper chip pad 420', an upper passivation layer 430', and an upper chip connection terminal 440'.

A level of an upper surface 330b' of the lower through electrode 330' of the lower semiconductor chip 30' may be higher than a level of a second surface 310b' of the lower semiconductor substrate 310'. For example, the upper surface 330b' of the lower through electrode 330' may be on the same plane as a surface of the lower passivation layer 360' arranged on the lower semiconductor substrate 310'. For example, as shown in FIG. 7, the upper surface 330b' of the lower through electrode 330' may be disposed at the same level as the upper surface of the lower passivation layer 360'.

Also, cross-sectional areas of the lower pad seed layer 350' and the lower bonding pad 340' of the lower semiconductor chip 30' in a horizontal direction according to a vertical direction may be uniform. Accordingly, cross-sectional areas of the lower pad seed layer 350' and the lower bonding pad 340' of the lower semiconductor chip 30' in the vertical direction may have a rectangular shape.

Referring to FIG. 6 again, a level of the upper surface 330b of the lower through electrode 330 of the lower semiconductor chip 30 according to an embodiment of the present inventive concepts may be lower than a level of the second surface 310b of the lower semiconductor substrate 310.

Accordingly, a substrate groove (110H of FIG. 15) defined by the inner surfaces of the lower semiconductor substrate 310 and the upper surface 330b of the lower through electrode 330 may be provided on an upper portion of the lower through electrode 330. The lower bonding pad 340 and the lower pad seed layer 350 of the lower semiconductor chip 30 may fill the substrate groove 110H of the lower semiconductor substrate 310.

A cross-section of the lower bonding pad 340 according to an embodiment of the present inventive concepts may have an alphabetical letter "T" shape. For example, a cross-section of the first lower pad portion 343 of the lower bonding pad 340 in the vertical direction may have a rectangular shape. In addition, a cross-section of the second lower pad portion 345 of the lower bonding pad 340 may have a rectangular shape having the length 345d in the horizontal direction that is greater than the length 343d of the first lower pad portion 343 in the horizontal direction. In an embodiment, the length of the first lower pad portion 343 in the vertical direction may be greater than the length of the second lower pad portion 345 in the vertical direction. However, embodiments of the present inventive concepts are not limited thereto.

Also, the lower pad seed layer 350 may be conformally formed along the lower surface of the lower bonding pad 340. For example, the first lower seed portion 353 of the lower pad seed layer 350 may be a portion of the lower pad seed layer 350 that overlaps the first lower pad portion 343 in the vertical direction. An upper surface of the first lower seed portion 353 may directly contact a lower surface of the first lower pad portion 343. The second lower seed portion 355 may be a portion of the lower pad seed layer 350 that surrounds the lateral side surfaces of the first lower pad portion 343 in the horizontal direction. The third lower seed portion 357 may be a portion of the lower pad seed layer 350 that does not overlap the first lower pad portion 343 of the lower bonding pad 340 in the vertical direction but overlaps the second lower pad portion 345 in the vertical direction.

An area of a contact region between the lower bonding pad 340 and the lower pad seed layer 350 of the lower semiconductor chip 30 of the semiconductor package 1 according to an embodiment of the present inventive concepts may be greater than an area of a contact region between the lower bonding pad 340' and the lower pad seed layer 350' of the lower semiconductor chip 30' of the semiconductor package 1' according to the comparative embodiment shown in FIG. 7.

For example, the area of the contact region between the lower bonding pad 340 and the lower pad seed layer 350 of the lower semiconductor chip 30 of the semiconductor package 1 according to an embodiment of the present inventive concepts may be greater than the area of the contact region between the lower bonding pad 340' and the lower pad seed layer 350' of the lower semiconductor chip 30' of the semiconductor package 1' according to a comparative embodiment by an area of the lateral side surfaces of the first lower pad portion 343 of the lower bonding pad 340.

The level of the upper surface 330b of the lower through electrode 330 of the lower semiconductor chip 30 of the semiconductor package 1 according to an embodiment of the present inventive concepts may be lower than the level of the second surface 310b of the lower semiconductor substrate 310, and the cross-section of the lower bonding pad 340, which is connected to the lower through electrode 330, in the vertical direction may have an alphabetical letter "T" shape. Therefore, the area of the contact region of the lower bonding pad 340 and the lower pad seed layer 350 of the lower semiconductor chip 30 may be increased.

Accordingly, in an operation of mounting the upper semiconductor chip 40 on the lower semiconductor chip 30 (e.g., an operation of placing the lower bonding pad 340 of the lower semiconductor chip 30 in contact with the upper chip connection terminal 440 of the upper semiconductor chip 40), a peeling phenomenon between the lower bonding pad 340 and the lower pad seed layer 350 may be reduced.

For example, the semiconductor package 1 according to an embodiment of the present inventive concepts may have increased structural reliability.

Figure 8:
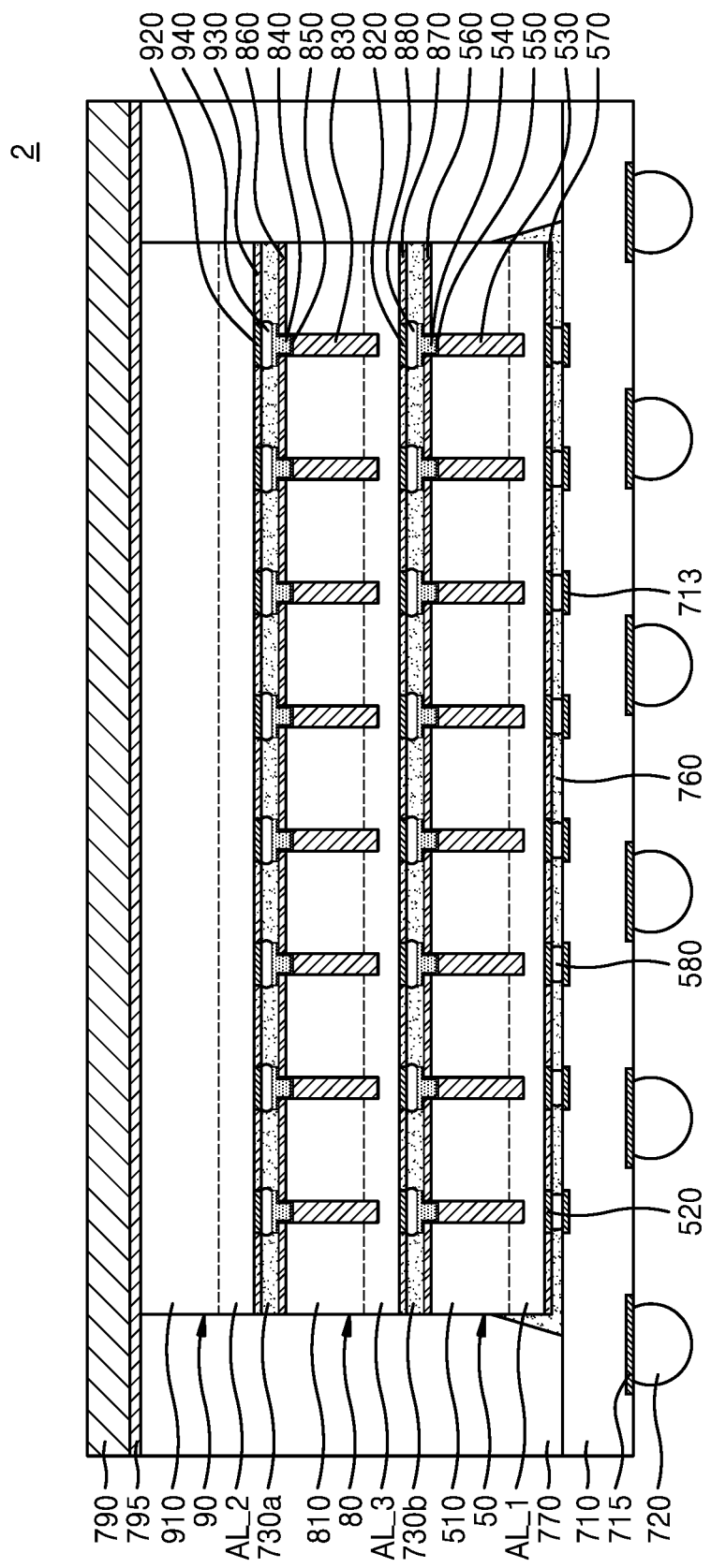
FIG. 8 is a cross-sectional view of a semiconductor package according to an embodiment of the present inventive concepts.

FIG. 8 is a cross-sectional view of a semiconductor package 2 according to an embodiment of the present inventive concepts.

Referring to FIG. 8, the semiconductor package 2 according to an embodiment of the present inventive concepts may include the package substrate 710, the package connection terminal 720, a lower semiconductor chip 50, an intermediate semiconductor chip 80, an upper semiconductor chip 90, a first adhesive layer 730a, a second adhesive layer 730b, the underfill member 760, the molding layer 770, a heat sink 790, or the like.

Hereinafter, differences between the semiconductor package 1 of FIG. 7 and the semiconductor package 2 of FIG. 8 will be mainly described, and redundant descriptions thereof will be omitted for convenience of explanation.

Although the semiconductor package 2 of FIG. 7 is illustrated as including three semiconductor chips (e.g., the lower semiconductor chip 50, the intermediate semiconductor chip 80, and the upper semiconductor chip 90), the number of semiconductor chips included in the semiconductor package 2 is not limited thereto. For example, the semiconductor package 2 may include four or more semiconductor chips.

The semiconductor package 2 according to an embodiment of the present inventive concepts may further include the intermediate semiconductor chip 80 disposed between the lower semiconductor chip 50 and the upper semiconductor chip 90 in the vertical direction.

As shown in the embodiment of FIG. 8, the lower semiconductor chip 50 may include a lower semiconductor substrate 510 having a lower active layer AL_1, a lower chip pad 520, a lower through electrode 530, a lower bonding pad 540, a lower pad seed layer 550, a first lower passivation layer 560, a second lower passivation layer 570, a lower chip connection terminal 580, or the like.

In addition, as shown in the embodiment of FIG. 8, the upper semiconductor chip 90 may include an upper semiconductor substrate 910 having an upper active layer AL_2, an upper chip pad 920, an upper passivation layer 930, an upper chip connection terminal 940, or the like.

Since the technical spirit of the lower semiconductor chip 50 and the upper semiconductor chip 90 of the semiconductor package 2 is similar or identical to the description given above with reference to FIG. 7, detailed descriptions thereof will be omitted for convenience of explanation.

As shown in the embodiment of FIG. 8, the intermediate semiconductor chip 80 may include an intermediate semiconductor chip 810 having an intermediate active layer AL_3, an intermediate chip pad 820, an intermediate through electrode 830, an intermediate bonding pad 840, an intermediate pad seed layer 850, a first intermediate passivation layer 860, a second intermediate passivation layer 870, an intermediate chip connection terminal 880, or the like.

Since structures of the intermediate bonding pad 840 and the intermediate pad seed layer 850 of the intermediate semiconductor chip 80 are substantially the same as structures of the lower bonding pad 540 and the lower pad seed layer 550 of the lower semiconductor chip 50, detailed descriptions of the intermediate bonding pad 840 and the intermediate pad seed layer 850 of the intermediate semiconductor chip 80 will be omitted for convenience of explanation.

In an embodiment, the intermediate chip connection terminal 880 of the intermediate semiconductor chip 80 may be disposed between the lower bonding pad 540 of the lower semiconductor chip 50 and the intermediate chip pad 820 of the intermediate semiconductor chip 80 in the vertical direction and may electrically connect the lower semiconductor chip 50 to the intermediate semiconductor chip 80.

In an embodiment, the intermediate bonding pad 840 of the intermediate semiconductor chip 80 may be in direct contact with the upper chip connection terminal 940 of the upper semiconductor chip 90. For example, the upper chip connection terminal 940 of the upper semiconductor chip 90 may be disposed between the intermediate bonding pad 840 of the intermediate semiconductor chip 80 and the upper chip pad 920 of the upper semiconductor chip 90 in the vertical direction and may electrically connect the intermediate semiconductor chip 80 to the upper semiconductor chip 90.

The first adhesive layer 730a of the semiconductor package 2 may be a layer arranged between the intermediate semiconductor chip 80 and the upper semiconductor chip 90 in the vertical direction and surrounding the intermediate bonding pad 840 of the intermediate semiconductor chip 80 and the upper chip connection terminal 940 of the upper semiconductor chip 90 in the horizontal direction.

The second adhesive layer 730b of the semiconductor package 2 may be a layer arranged between the lower semiconductor chip 50 and the intermediate semiconductor chip 80 in the vertical direction and surrounding the lower bonding pad 540 of the lower semiconductor chip 50 and the intermediate chip connection terminal 880 of the intermediate semiconductor chip 80 in the horizontal direction.

The underfill member 760 of the semiconductor package 2 may be a layer that fills a space between the lower semiconductor chip 50 and the package substrate 710 and surrounds the lower chip connection terminal 580 of the lower semiconductor chip 50.

The molding layer 770 may be a layer surrounding a plurality of semiconductor chips (e.g., the lower semiconductor chip 50, the intermediate semiconductor chip 80, and the upper semiconductor chip 90) on the package substrate 710. Also, the molding layer 770 may be a layer fixing the plurality of semiconductor chips (e.g., the lower semiconductor chip 50, the intermediate semiconductor chip 80, and the upper semiconductor chip 90) on the package substrate 710.

In an embodiment, an upper surface of the molding layer 770 may be on the same plane as an upper surface of the upper semiconductor chip 90. For example, the level of the upper surface of the molding layer 770 may be the same as the level of the upper surface of the upper semiconductor chip 90. However, embodiments of the present inventive concepts are not limited thereto. For example, in an embodiment, the molding layer 770 may cover the upper surface of the upper semiconductor chip 90.

In addition, the heat sink 790 may be disposed on the molding layer 770 and may be configured to discharge heat generated by the plurality of semiconductor chips (e.g., the lower semiconductor chip 50, the intermediate semiconductor chip 80, and the upper semiconductor chip 90) to the outside.

In an embodiment, the heat sink 790 may include a metal-based material having excellent thermal conductivity. However, embodiments of the present inventive concepts are not limited thereto, and the heat sink 790 may include a ceramic-based material, a carbon-based material, a polymer-based material, or the like.

In addition, in an embodiment, a structure of the heat sink 790 may also be a concave-convex structure in which concavity and convexity are repeated to increase the heat radiation performance of the semiconductor package 2.

As shown in the embodiment of FIG. 8, the heat sink 790 may be fixed on the molding layer 770 by an adhesive film 795. For example, the adhesive film 795 may have its own adhesive characteristic, or may be also provided by being adhered to a separate thermally conductive adhesive tape. For example, the adhesive tape may be a double-sided adhesive tape.

Figure 9:
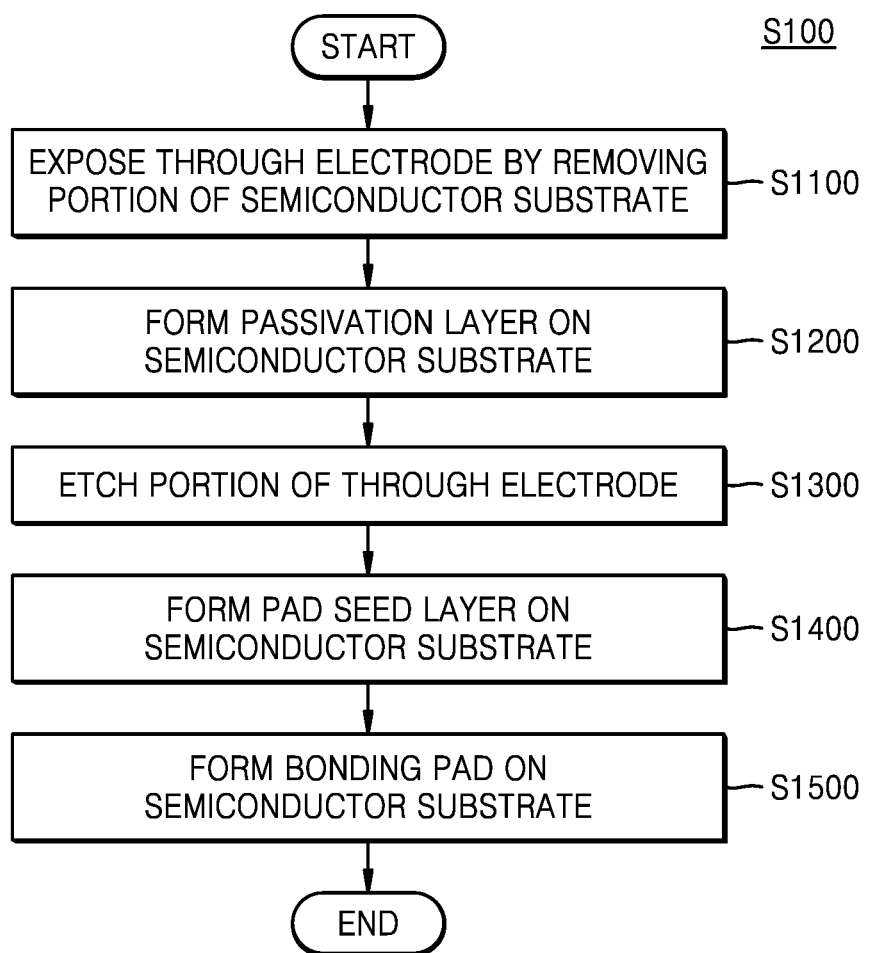
FIG. 9 is a flowchart illustrating some operations of a method of manufacturing a semiconductor chip, according to an embodiment of the present inventive concepts.

FIG. 9 is a flowchart illustrating some operations of a method S100 of manufacturing the semiconductor chip 10, according to an embodiment of the present inventive concepts. Also, FIGS. 10 to 19 are diagrams showing operations of the method S100 of manufacturing the semiconductor chip 10, according to embodiments of the present inventive concepts, respectively.

Referring to FIG. 9, the method S100 of manufacturing the semiconductor chip 10 according to an embodiment of the present inventive concepts may include exposing the through electrode 130 by removing a portion of the semiconductor substrate 110 in block S1100, forming the first passivation layer 160 on the semiconductor substrate 110 in block S1200, etching a portion of the through electrode 130 in block S1300, forming the pad seed layer 150 on the semiconductor substrate 110 in block S1400, and forming the bonding pad 140 on the semiconductor substrate 110 in block S1500.

Referring to FIGS. 9 to 12 together, block S1100 may include block S1150 (FIG. 11) of grinding a portion of the semiconductor substrate 110 and block S1170 (FIG. 12) of selectively removing a portion of the semiconductor substrate 110, such as an upper portion of the semiconductor substrate 110 to expose the upper surface 130b of the through electrode 130.

Figure 10:
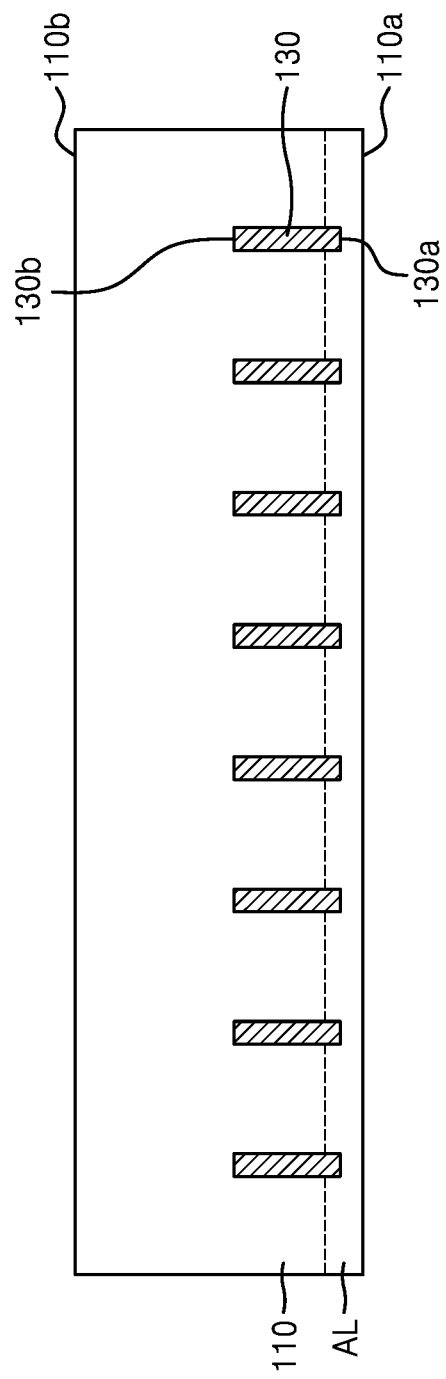
FIGS. 10 to 19 are diagrams showing operations of a method of manufacturing a semiconductor chip, according to embodiments of the present inventive concepts, respectively.

Referring to FIG. 10, the semiconductor substrate 110 having the first surface 110a and the second surface 110b and having the active layer AL in a portion thereof adjacent to the first surface 110a thereof (e.g., in the vertical direction), and the through electrode 130 embedded in the semiconductor substrate 110 and connected to the active layer AL may be provided.

In an embodiment, a length of the semiconductor substrate 110 in the vertical direction may be in a range of about 700 micrometers or more. For example, in an embodiment, a length of the semiconductor substrate 110 in the vertical direction may be about 770 micrometers. In addition, a length of the through electrode 130, which is embedded in the semiconductor substrate 110, in the vertical direction may be about 50 micrometers. However, embodiments of the present inventive concepts are not limited thereto.

Figure 11:
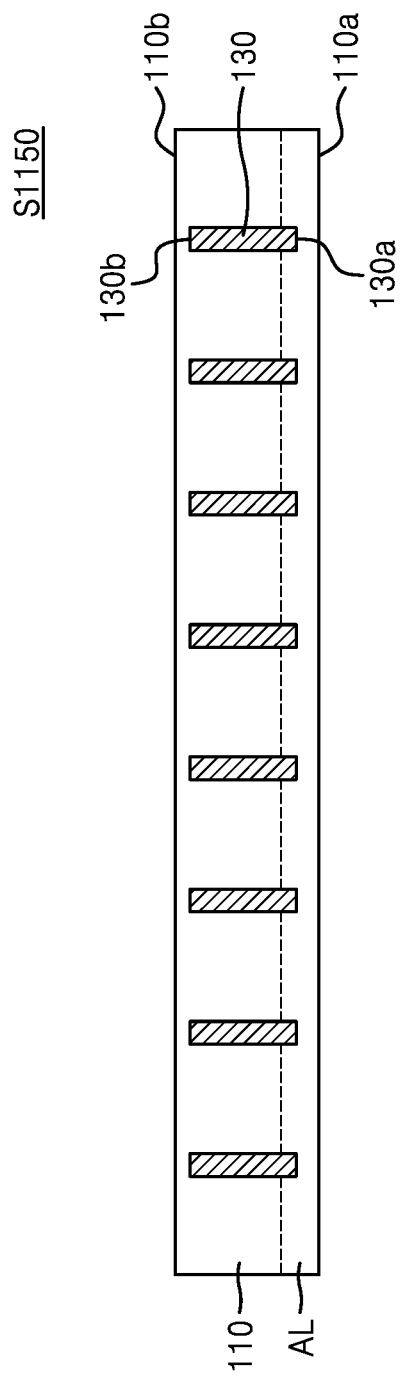

Referring to FIG. 11, block S1150 may be an operation of removing a portion of the semiconductor substrate 110 by grinding the second surface 110b of the semiconductor substrate 110. In an embodiment, in block S1100, a portion of the semiconductor substrate 110 may be physically removed until a level of the second surface 110b of the semiconductor substrate 110 is relatively higher than a level of the upper surface of the through electrode 130.

Figure 12:
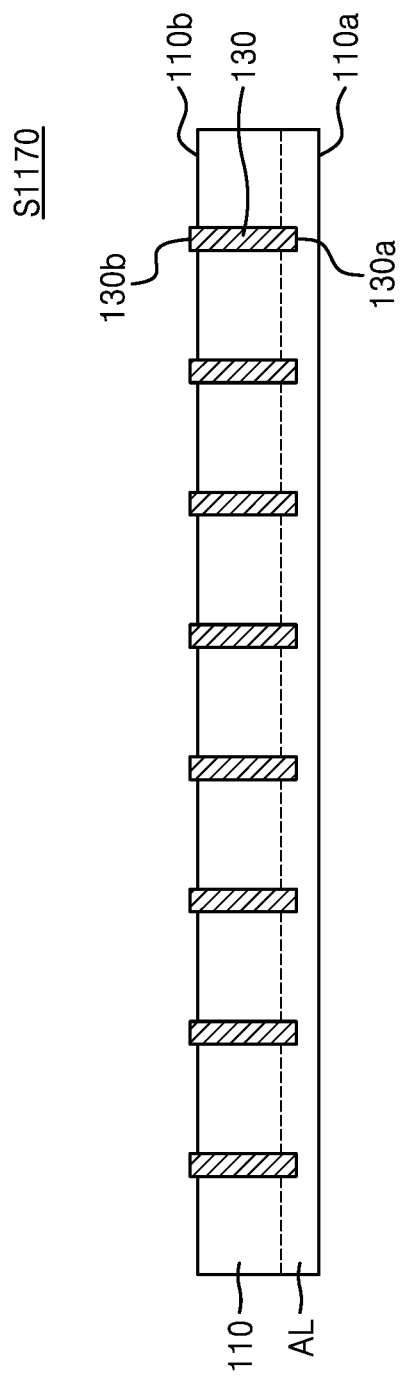

Referring to FIG. 12, block S1170 may be an operation of exposing the through electrode 130 from the semiconductor substrate 110 by selectively removing a portion of the semiconductor substrate 110. In an embodiment, in block S1170, a portion of the semiconductor substrate 110 may be removed until the level of the second surface 110b of the semiconductor substrate 110 is lower than the level of the upper surface of the through electrode 130.

In an embodiment, when the semiconductor substrate 110 includes a silicon material, a portion of the semiconductor substrate 110 may be removed through a chemical solution. The chemical solution may be a solution that selectively removes only the semiconductor substrate 110 through a chemical reaction. In block S1170, the through electrode 130 might not be removed because there is no chemical reaction between the material of the through electrode 130 and the chemical solution.

Figure 13:
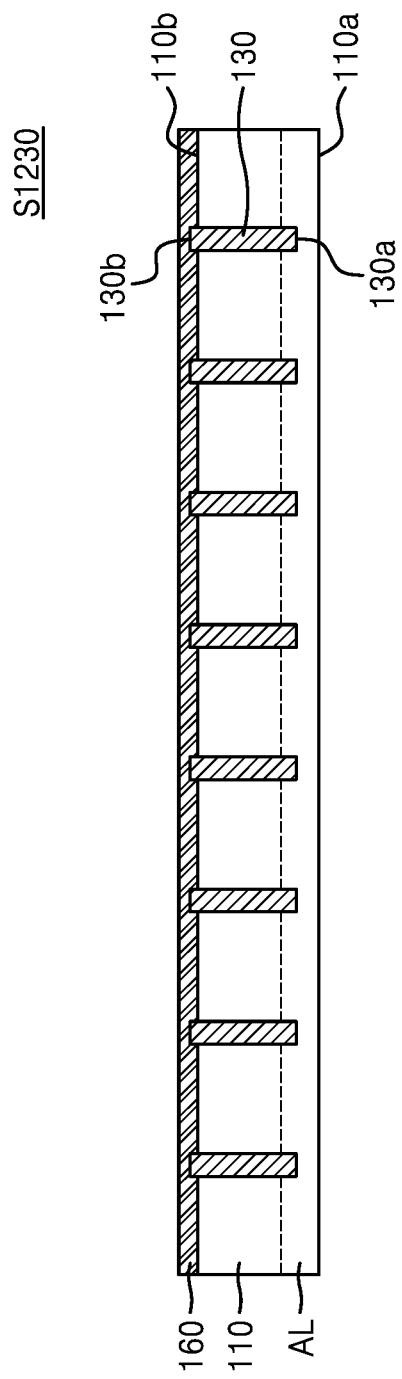
Figure 14:
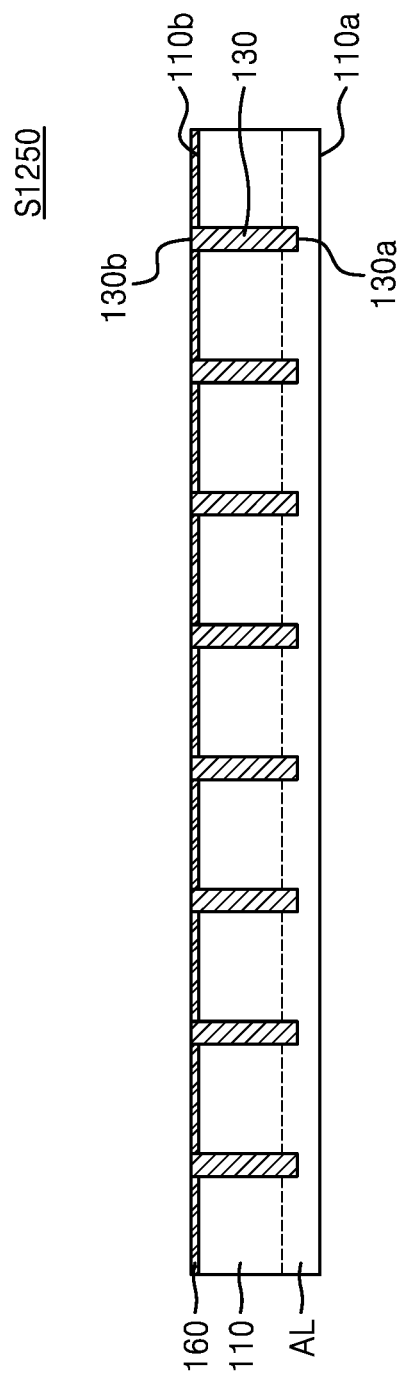

Referring to FIGS. 9, 13, and 14 together, block S1200 may include applying the first passivation layer 160 on the second surface 110b of the semiconductor substrate 110 in block S1230 and etching a portion of the first passivation layer 160 and a portion of the through electrode 130 in block S1250.

As shown in the embodiment of FIG. 13, in block S1230, the first passivation layer 160 may be applied on the second surface 110b of the semiconductor substrate 110 to cover the through electrode 130 exposed from the semiconductor substrate 110 in block S1170.

As shown in the embodiment of FIG. 14, in block S1250, a portion of the first passivation layer 160 and the through electrode 130 may be ground until a surface of the through electrode 130 is exposed.

In an embodiment, when block S1250 is performed, a surface of the first passivation layer 160 and a surface of the through electrode 130 may be on the same plane. For example, the first passivation layer 160 may surround side portions of the through electrode 130 on the second surface 110b of the semiconductor substrate 110 and expose the upper surface of the through electrode 130 to the outside. The upper surfaces of the through electrode 130 and the first passivation layer 160 may be disposed on the same level.

Figure 15:
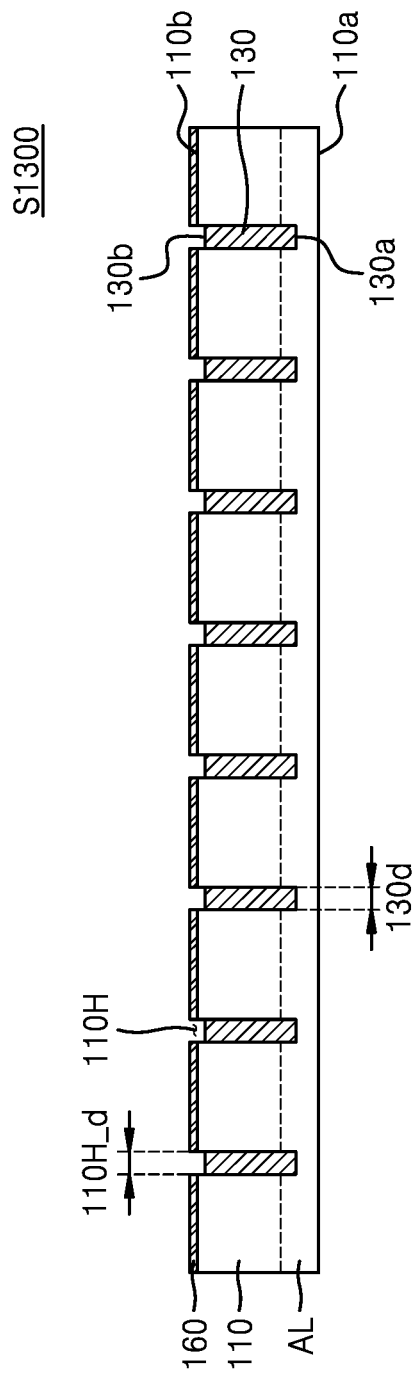

Referring to FIGS. 9 and 15 together, block S1300 may be an operation of selectively etching only a portion of the through electrode 130 without etching the semiconductor substrate 110.

In an embodiment, block S1300 may be a wet etching operation in which a portion of the through electrode 130 is etched by using a chemical product that selectively dissolves only the through electrode 130.

However, embodiments of the present inventive concepts are not limited thereto. For example, in an embodiment, block S1300 may be a dry etching operation in which a portion of the through electrode 130 is etched through a chemical reaction by gas plasma or activated gas.

In addition, through performing the etching operation in block S1300, the level of the upper surface 130b of the through electrode 130 may be lower than the level of the second surface 110b of the semiconductor substrate 110. Accordingly, the substrate groove 110H defined by the inner surfaces of the semiconductor substrate 110 and the upper surface 130b of the through electrode 130 may be formed on an upper portion of the through electrode 130.

In an embodiment, a length of the substrate groove 110H of the semiconductor substrate 110 in the vertical direction may be in a range of about 2 micrometers to about 6 micrometers. For example, a length at which the through electrode 130 is removed in the vertical direction may be about 4 micrometers.

In an embodiment, the length of the substrate groove 110H of the semiconductor substrate 110 in the vertical direction may be adjusted through a control on the performing time of an etching operation performed in block S1300.

In an embodiment, a length 110H_d of the substrate groove 110H of the semiconductor substrate 110 in the horizontal direction may be greater than the length 130d of the through electrode 130 in the horizontal direction. However, embodiments of the present inventive concepts are not limited thereto, and the length 110H_d of the substrate groove 110H of the semiconductor substrate 110 in the horizontal direction may be substantially the same as the length 130*d* of the through electrode 130 in the horizontal direction.

Figure 16:
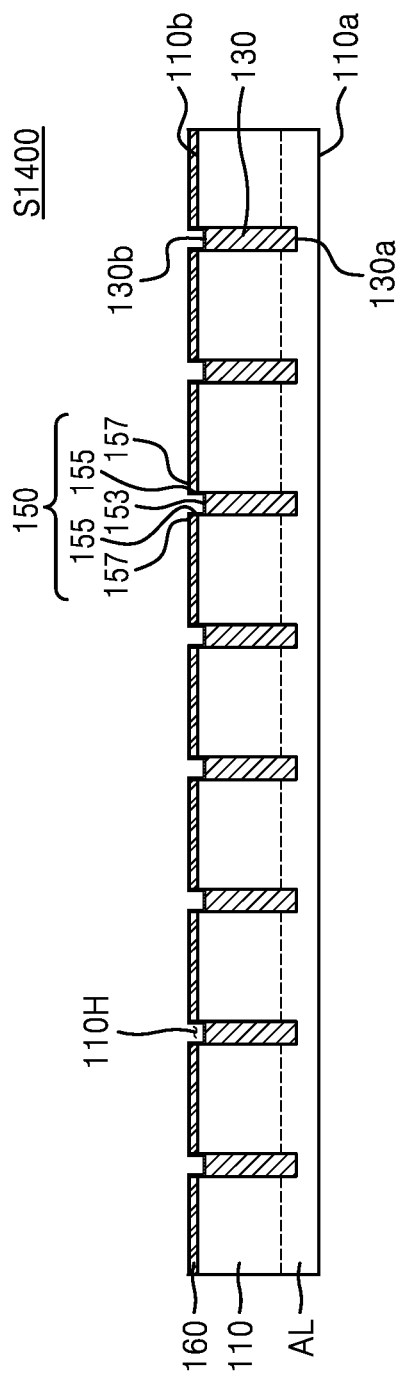

Referring together to FIGS. 9 and 16, in block S1400 an operation of conformally forming the pad seed layer 150 on the semiconductor substrate 110 may be performed.

In an embodiment, the pad seed layer 150 may be formed on the second surface 110*b* of the semiconductor substrate 110 and in the substrate groove 110H through a physical vapor deposition operation. For example, in an embodiment, the pad seed layer 150 may be formed on the second surface 110*b* of the semiconductor substrate 110 and in the substrate groove 110H while having a thickness in a range of about 200 nanometers to about 300 nanometers.

Referring to FIGS. 9, 17 to 19, block S1500 may include the operation of forming a photoresist material layer PR in block S1530, the operation of forming the bonding pad 140 in block S1550, and the operation of removing the photoresist material layer PR and a portion of the pad seed layer 150 in block S1570.

Figure 17:
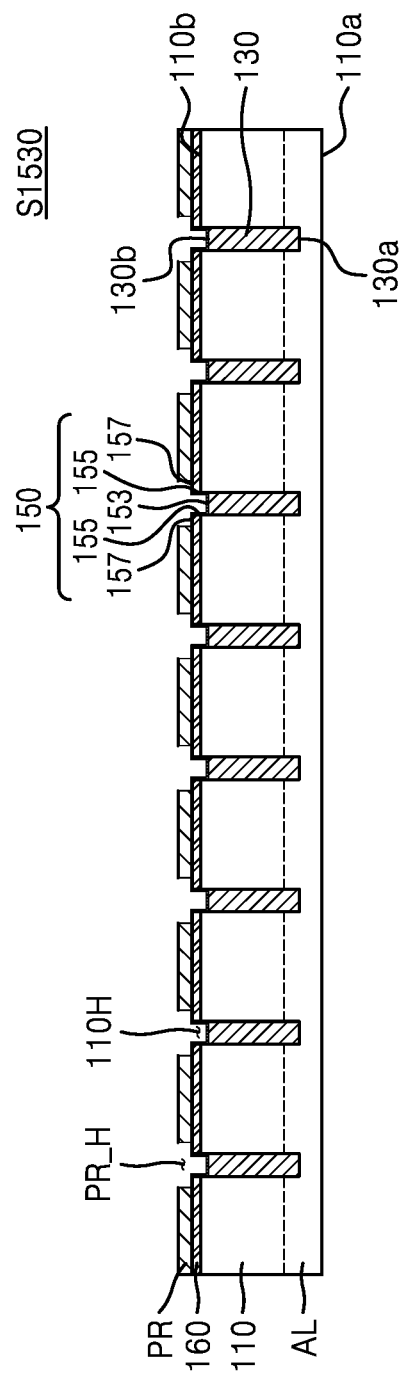

Referring to FIG. 17, in block S1530, the photoresist material layer PR may be formed on the pad seed layer 150. The photoresist material layer PR may have pattern holes PR_H exposing the pad seed layer 150 through an exposure operation, a development operation, or the like.

Figure 18:
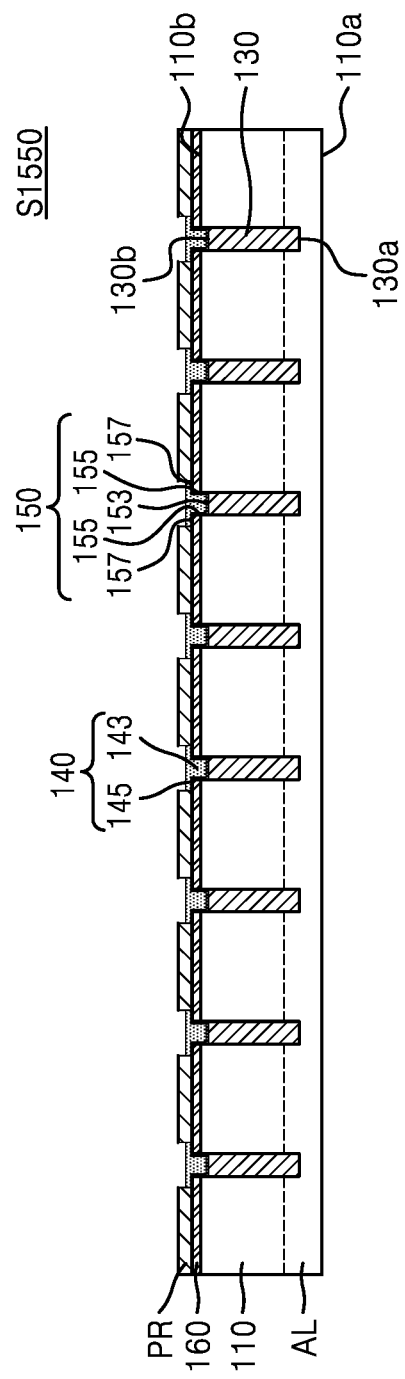

Referring to FIG. 18, an operation of forming the bonding pad 140 through a plating operation using the pad seed layer 150 exposed by the photoresist material layer PR may be performed in block S1550. In an embodiment, the bonding pad 140 may fill the pattern holes PR_H of the photoresist material layer PR.

Figure 19:
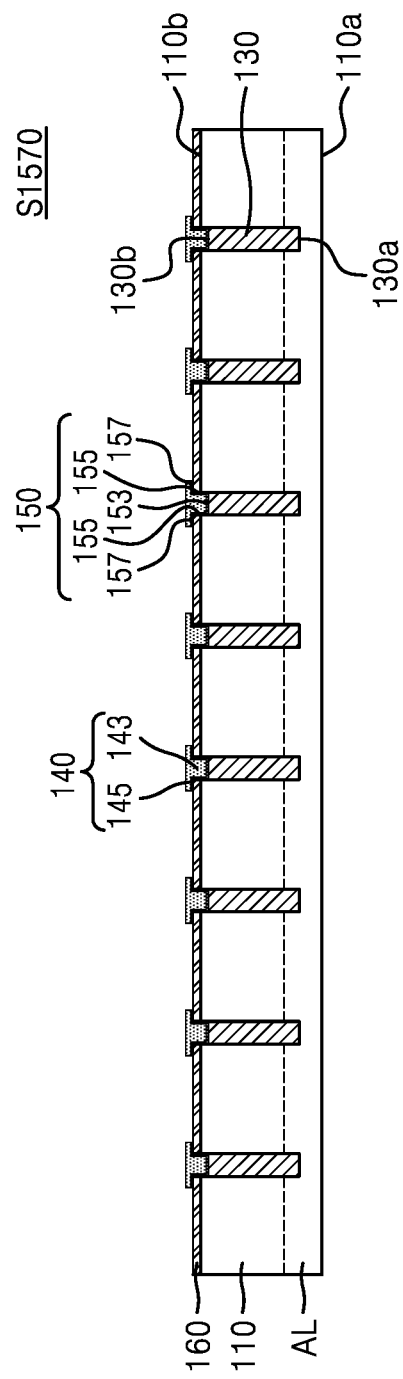

Referring to FIG. 19, an operation of removing the photoresist material layer PR and the pad seed layer 150 which does not overlap the bonding pad 140 in the vertical direction may be performed in block S1570.

In an embodiment, in block S1570, the first passivation layer 160 may be used as a stopper layer. For example, portions of the pad seed layer 150 which does not overlap the bonding pad 140 in the vertical direction may be removed to expose the first passivation layer 160 to the outside.

While embodiments of the present inventive concepts have been shown and described with reference to the non-limiting embodiments thereof, it will be understood that various changes in form and details may be made therein without departing from the spirit and scope of the present inventive concepts.

What is claimed is:

1. A semiconductor chip comprising:
a semiconductor substrate having a first surface and a second surface opposite to the first surface, and an active layer disposed in a portion of the semiconductor substrate that is adjacent to the first surface;
a through electrode extending in the semiconductor substrate in a vertical direction, the through electrode having a lower surface connected to the active layer and an upper surface positioned at a level lower than a level of the second surface of the semiconductor substrate;
a passivation layer disposed on the second surface of the semiconductor substrate; and
a bonding pad arranged on a portion of the passivation layer and the upper surface of the through electrode, the bonding pad having a cross-section with a "T" shape in the vertical direction, the bonding pad is connected to the through electrode, wherein the bonding pad comprises:
a first pad portion surrounded by the semiconductor substrate and the passivation layer; and
a second pad portion disposed on the first pad portion and the passivation layer, the second pad portion having a greater length in a horizontal direction than a length of the first pad portion in the horizontal direction,
wherein the length of the first pad portion of the bonding pad in the horizontal direction is greater than a length of the through electrode in the horizontal direction.

2. The semiconductor chip of claim 1, wherein:
the length of the first pad portion of the bonding pad in the horizontal direction is in a range of about 2 micrometers to about 6 micrometers; and
the length of the second pad portion of the bonding pad in the horizontal direction is in a range of about 15 micrometers to about 20 micrometers.

3. The semiconductor chip of claim 2, wherein a length of the second pad portion of the bonding pad in the vertical direction is in a range of about 2 micrometers to about 3 micrometers.

4. The semiconductor chip of claim 1, further comprising:
a pad seed layer disposed on a lower portion of the bonding pad and conformally formed along a portion of an upper surface of the passivation layer and the upper surface of the through electrode.

5. The semiconductor chip of claim 4, wherein the pad seed layer comprises:
a first seed portion between the through electrode and the first pad portion in the vertical direction;
a second seed portion extending from the first seed portion in the vertical direction and surrounding a lateral side surface of the first pad portion in the horizontal direction; and
a third seed portion extending from the second seed portion in the horizontal direction and disposed between the passivation layer and an edge of the second pad portion in the vertical direction.

6. The semiconductor chip of claim 5, wherein:
the pad seed layer is composed of copper stacked on titanium; and
the bonding pad is composed of gold is stacked on nickel.

7. A semiconductor chip comprising:
a semiconductor substrate having a first surface and a second surface opposite to the first surface, and an active layer disposed in a portion of the semiconductor substrate that is adjacent to the first surface;
a through electrode extending in the semiconductor substrate in a vertical direction, the through electrode having a lower surface connected to the active layer and an upper surface positioned at a level lower than a level of the second surface of the semiconductor substrate;
a chip pad disposed on the first surface of the semiconductor substrate and connected to the active layer;
a passivation layer disposed on the second surface of the semiconductor substrate;
a bonding pad arranged on a portion of the passivation layer and the upper surface of the through electrode, the bonding pad having a cross-section with a "T" shape in the vertical direction, the bonding pad is connected to the through electrode; and
a pad seed layer disposed on a lower portion of the bonding pad, wherein the bonding pad comprises:
a first pad portion surrounded by the semiconductor substrate and the passivation layer; and
a second pad portion disposed on the passivation layer and the first pad portion, the second pad portion having a greater length in a horizontal direction than a length of the first pad portion in the horizontal direction,
wherein the length of the first pad portion in the horizontal direction is greater than a length of the through electrode in the horizontal direction.

8. The semiconductor chip of claim 7, wherein:
a thickness of the pad seed layer is in a range of about 200 nanometers to about 300 nanometers; and
the pad seed layer comprises:
a first seed portion overlapping the first pad portion of the bonding pad in the vertical direction;
a second seed portion overlapping the first pad portion of the bonding pad in the horizontal direction; and
a third seed portion overlapping ends of the second pad portion in the vertical direction, the third seed portion does not overlap the first pad portion of the bonding pad in the vertical direction.

9. The semiconductor chip of claim 7, further comprising:
a redistribution structure arranged on the first surface of the semiconductor substrate, wherein the redistribution structure comprises: a redistribution insulating layer; a redistribution line pattern extending in the redistribution insulating layer in a horizontal direction; and a redistribution via pattern extending in the redistribution insulating layer in the vertical direction and connecting the redistribution line pattern to the chip pad.

10. The semiconductor chip of claim 7, wherein:
the length of the first pad portion of the bonding pad in the horizontal direction is in a range of about 2 micrometers to about 6 micrometers;
the length of the second pad portion of the bonding pad in the horizontal direction is in a range of about 15 micrometers to about 20 micrometers; and
a length of the second pad portion of the bonding pad in the vertical direction is about 2 micrometers to about 3 micrometers.

11. The semiconductor chip of claim 7, wherein:
the pad seed layer is composed of copper stacked on titanium; and
the bonding pad is composed of gold stacked on nickel.

12. A semiconductor package comprising:
a package substrate;
a lower semiconductor chip mounted on the package substrate, wherein the lower semiconductor chip comprises: a lower semiconductor substrate having a first surface and a second surface opposite to the first surface and having a lower active layer at a portion of the lower semiconductor substrate adjacent to the first surface thereof; a lower through electrode extending in the lower semiconductor substrate in a vertical direction, the through electrode having a lower surface connected to the lower active layer and an upper surface positioned at a level lower than a level of the second surface of the lower semiconductor substrate; a lower passivation layer disposed on the second surface of the lower semiconductor substrate; a lower bonding pad arranged on a portion of the lower passivation layer and the upper surface of the lower through electrode, the lower bonding pad having a cross-section with a "T" shape in the vertical direction, the lower bonding pad is connected to the lower through electrode; and a lower pad seed layer arranged on a lower portion of the lower bonding pad;
an upper semiconductor chip mounted on the lower semiconductor chip, wherein the upper semiconductor chip comprises: an upper semiconductor substrate having a third surface facing the lower semiconductor chip and a fourth surface opposite to the third surface and having an upper active layer at a portion of the upper semiconductor chip adjacent to the third surface thereof; an upper chip pad disposed on the third surface of the upper semiconductor substrate and connected to the upper active layer; and an upper chip connection terminal disposed between the upper chip pad and the lower bonding pad; and
a molding layer surrounding the lower semiconductor chip and the upper semiconductor chip on the package substrate.

13. The semiconductor package of claim 12, wherein the lower bonding pad of the lower semiconductor chip comprises:
a first lower pad portion surrounded by the lower semiconductor substrate and the lower passivation layer; and
a second lower pad portion disposed on the lower passivation layer and the first lower pad portion and having a greater length in a horizontal direction than a length of the first lower pad portion in the horizontal direction,
wherein the length of the first lower pad portion in the horizontal direction is greater than a length of the lower through electrode in the horizontal direction.

14. The semiconductor package of claim 12, wherein:
a thickness of the lower pad seed layer is in a range of about 200 nanometers to about 300 nanometers, and
the lower pad seed layer is composed of copper stacked on titanium.

15. The semiconductor package of claim 13, wherein:
the length of the first lower pad portion of the lower bonding pad in the horizontal direction is in a range of about 2 micrometers to about 6 micrometers;
the length of the second lower pad portion of the lower bonding pad in the horizontal direction is in a range of about 15 micrometers to about 20 micrometers; and
a length of the second lower pad portion of the lower bonding pad in the vertical direction is in a range of about 2 micrometers to about 3 micrometers.

16. The semiconductor package of claim 12, wherein the lower semiconductor chip further comprises:
a lower chip pad disposed on the first surface of the lower semiconductor substrate and connected to the lower active layer; and
a lower chip connection terminal disposed between the lower chip pad and the package substrate,
wherein the semiconductor package comprises:
an underfill member filling a space between the lower semiconductor chip and the package substrate and surrounding the lower chip connection terminal; and
an adhesive layer arranged between the lower semiconductor chip and the upper semiconductor chip and surrounding the lower bonding pad of the lower semiconductor chip and the upper chip connection terminal of the upper semiconductor chip.

17. The semiconductor package of claim 12, wherein:
an upper surface of the molding layer is on a same plane as the fourth surface of the upper semiconductor chip, wherein the semiconductor package further includes a heat sink disposed on the molding layer.

* * * * *